United States Patent
Lachica

(10) Patent No.: US 10,698,015 B2
(45) Date of Patent: Jun. 30, 2020

(54) SYSTEMS AND METHODS TO FACILITATE DETECTING AN ELECTROMAGNETIC RADIATION IN A SPACE BY USING A SELF-POWERED RADIO FREQUENCY DEVICE (SP-RF DEVICE)

(71) Applicant: Rey Dandy Provido Lachica, Colton, CA (US)

(72) Inventor: Rey Dandy Provido Lachica, Colton, CA (US)

( * ) Notice: Subject to any disclaimer, the term of this patent is extended or adjusted under 35 U.S.C. 154(b) by 0 days.

(21) Appl. No.: 16/157,485

(22) Filed: Oct. 11, 2018

(65) Prior Publication Data

US 2019/0107566 A1    Apr. 11, 2019

Related U.S. Application Data

(60) Provisional application No. 62/570,830, filed on Oct. 11, 2017.

(51) Int. Cl.
*G01R 29/08* (2006.01)
*G08B 21/18* (2006.01)

(52) U.S. Cl.
CPC ..... *G01R 29/0814* (2013.01); *G01R 29/0878* (2013.01); *G01R 29/0892* (2013.01); *G08B 21/182* (2013.01)

(58) Field of Classification Search
None
See application file for complete search history.

(56) References Cited

U.S. PATENT DOCUMENTS

| | | | | | |
|---|---|---|---|---|---|
| 2,594,019 | A | * | 4/1952 | Holman | H04B 3/44 307/64 |
| 3,783,448 | A | * | 1/1974 | Brodwin | G01R 29/0878 342/351 |
| 3,800,208 | A | * | 3/1974 | MacHarg | H02J 7/0086 320/139 |
| 3,927,375 | A | * | 12/1975 | Lanoe | G01R 29/0857 343/894 |
| 3,946,397 | A | * | 3/1976 | Irwin | H01Q 7/08 343/788 |

(Continued)

FOREIGN PATENT DOCUMENTS

| GB | 2194865 A | * | 3/1988 | ......... G01R 29/0814 |
|---|---|---|---|---|
| GB | 2236593 A | * | 4/1991 | ......... G01R 29/0814 |
| WO | WO-03083495 A1 | * | 10/2003 | ......... G01R 29/0814 |

*Primary Examiner* — Chico A Foxx

(57) ABSTRACT

A self-powered radio frequency device for detecting electromagnetic (EM) radiation is disclosed. The self-powered radio frequency device may include a plurality of EM collector devices configured for collecting EM radiation corresponding to a plurality of frequency bands. Further, the self-powered radio frequency device may include at least one converter device electrically coupled to the plurality of EM collector devices. Further, the at least one converter device may be configured for converting the EM radiation into electrical energy. Further, the self-powered radio frequency device may include at least one indicator device electrically coupled to the at least one converter device. Further, the at least one indicator device may be configured for generating at least one indication based on the electrical energy corresponding to at least one frequency band of the plurality of frequency bands.

18 Claims, 14 Drawing Sheets

(56) References Cited

U.S. PATENT DOCUMENTS

| | | | | | |
|---|---|---|---|---|---|
| 4,032,910 | A | * | 6/1977 | Hollway | G01R 19/16585 340/600 |
| 4,199,716 | A | * | 4/1980 | Reindel | G01R 19/16585 219/720 |
| 4,329,580 | A | * | 5/1982 | Riley | G01R 29/0892 250/215 |
| 4,338,595 | A | * | 7/1982 | Newman | G01R 27/04 250/250 |
| 4,634,968 | A | * | 1/1987 | Aslan | G01R 21/10 324/119 |
| 5,592,148 | A | * | 1/1997 | Morales | G08B 21/182 340/522 |
| 5,612,610 | A | * | 3/1997 | Borghi | G05F 1/614 323/222 |
| 5,859,590 | A | * | 1/1999 | Otani | H02H 1/0015 324/520 |
| 6,154,178 | A | * | 11/2000 | Aslan | G01R 29/0857 340/600 |
| 6,414,400 | B1 | * | 7/2002 | Scott | F02P 9/005 290/40 A |
| 6,693,536 | B2 | * | 2/2004 | Bauer, Jr. | G01R 29/0814 250/493.1 |
| 7,796,092 | B2 | * | 9/2010 | Holly | H01Q 23/00 343/820 |
| 9,184,698 | B1 | * | 11/2015 | Wiser | H03L 7/06 |
| 9,472,699 | B2 | * | 10/2016 | Kotter | G02B 5/281 |
| 10,297,134 | B2 | * | 5/2019 | Zeuch | H02M 1/10 |
| 2002/0075189 | A1 | * | 6/2002 | Carillo, Jr. | H01Q 1/245 343/702 |
| 2003/0080277 | A1 | * | 5/2003 | Bauer, Jr. | G01R 29/0814 250/205 |
| 2004/0183529 | A1 | * | 9/2004 | Kajiwara | G01R 29/0814 324/247 |
| 2006/0139227 | A1 | * | 6/2006 | Shigihara | H01Q 1/38 343/788 |
| 2008/0113675 | A1 | * | 5/2008 | Harris | H04W 4/023 455/456.3 |
| 2009/0108202 | A1 | * | 4/2009 | Gritz | G01J 5/08 250/338.1 |
| 2009/0109103 | A1 | * | 4/2009 | Pendry | H01Q 19/06 343/703 |
| 2009/0109112 | A1 | * | 4/2009 | Pendry | H01Q 1/245 343/787 |
| 2009/0210177 | A1 | * | 8/2009 | McCullough | G01R 29/0871 702/60 |
| 2010/0171051 | A1 | * | 7/2010 | Smirnov | A61N 1/16 250/505.1 |
| 2010/0253481 | A1 | * | 10/2010 | Zand | G01S 5/14 340/10.3 |
| 2010/0321192 | A1 | * | 12/2010 | Brannan | A61B 18/1492 340/600 |
| 2011/0304515 | A1 | * | 12/2011 | Wellman | G01J 5/061 343/720 |
| 2012/0139420 | A1 | * | 6/2012 | Lee | H05B 33/0815 315/122 |
| 2013/0114169 | A1 | * | 5/2013 | Werner | H05B 33/0884 361/56 |
| 2013/0252469 | A1 | * | 9/2013 | Mochizuki | H01R 4/2433 439/626 |
| 2014/0039821 | A1 | * | 2/2014 | Audet | G01R 29/0857 702/66 |
| 2014/0080434 | A1 | * | 3/2014 | Louzir | G01R 29/0892 455/214 |
| 2014/0172374 | A1 | * | 6/2014 | Brady | G01N 21/3581 702/189 |
| 2015/0241493 | A1 | * | 8/2015 | Canne | G01R 29/0814 324/612 |
| 2015/0358337 | A1 | * | 12/2015 | Keller | H04W 12/12 726/23 |
| 2017/0018835 | A1 | * | 1/2017 | Lai | H01Q 5/328 |
| 2017/0046939 | A1 | * | 2/2017 | Zeuch | H02M 1/10 |
| 2017/0274200 | A1 | * | 9/2017 | Towe | A61N 1/37205 |
| 2018/0076376 | A1 | * | 3/2018 | Brady | H01L 35/02 |
| 2018/0245365 | A1 | * | 8/2018 | Wankewycz | B64C 39/024 |
| 2018/0262155 | A1 | * | 9/2018 | Fountain | F03G 6/06 |
| 2019/0018053 | A1 | * | 1/2019 | Jupudi | H01L 21/67253 |

* cited by examiner

SYSTEMS AND METHODS TO FACILITATE DETECTING AN ELECTROMAGNETIC RADIATION IN A SPACE BY USING A SELF-POWERED RADIO FREQUENCY DEVICE (SP-RF DEVICE)

FIELD OF THE INVENTION

The present invention relates generally to a field of communications. More specifically, the present invention relates to systems and methods to facilitate detecting an electromagnetic radiation in a space by using a self-powered radio frequency device (SP-RF device).

BACKGROUND OF THE INVENTION

Conventional methods for detecting an electromagnetic (EM) radiation at a transmitter site and/or a receiver site may involve one or more technicians to set up an arrangement that may be complex and/or may require constant maintenance. Further, the arrangement for detecting the EM radiations may be dependent on a battery for its (arrangement's) working. Further, a battery-powered arrangement for EM radiation detection, in an instance, may be at a high risk of explosion when exposed in high and/or extreme radio frequency environment. Further, conventional EM detecting arrangements, in an instance, may be based on critical semiconductor, transistors and/or chip technology and therefore may require a lot of parameters to consider. Consequently, such EM detectors may not be easy to use and/or may require constant monitoring and/or maintenance. Further, such EM detecting arrangements, in an instance, may occupy a significant amount of space and/or may not be configured to be attached to an antenna and/or a high voltage power line. Further, such EM detecting arrangements may be expensive and/or may not be economical. Further, a strong EM radiation, in an instance, may deteriorate a life associated with such EM detecting arrangements with complex components.

Therefore, there is a need for improved methods and systems to facilitate detecting an electromagnetic radiation in a space by using a self-powered radio frequency device (SP-RF device) that may overcome one or more of the above-mentioned problems and/or limitations.

SUMMARY

This summary is provided to introduce a selection of concepts in a simplified form, that are further described below in the Detailed Description. This summary is not intended to identify key features or essential features of the claimed subject matter. Nor is this summary intended to be used to limit the claimed subject matter's scope.

According to some embodiments, a self-powered radio frequency device for detecting electromagnetic (EM) radiation is provided. The self-powered radio frequency device may include a plurality of EM collector devices configured for collecting EM radiation corresponding to a plurality of frequency bands. Further, the self-powered radio frequency device may include at least one converter device electrically coupled to the plurality of EM collector devices. Further, the at least one converter device may be configured for converting the EM radiation into electrical energy. Further, the self-powered radio frequency device may include at least one indicator device electrically coupled to the at least one converter device. Further, the at least one indicator device may be configured for generating at least one indication based on the electrical energy corresponding to at least one frequency band of the plurality of frequency bands.

Both the foregoing summary and the following detailed description provide examples and are explanatory only. Accordingly, the foregoing summary and the following detailed description should not be considered to be restrictive. Further, features or variations may be provided in addition to those set forth herein. For example, embodiments may be directed to various feature combinations and sub-combinations described in the detailed description.

BRIEF DESCRIPTION OF THE DRAWINGS

The accompanying drawings, which are incorporated in and constitute a part of this disclosure, illustrate various embodiments of the present disclosure. The drawings contain representations of various trademarks and copyrights owned by the Applicants. In addition, the drawings may contain other marks owned by third parties and are being used for illustrative purposes only. All rights to various trademarks and copyrights represented herein, except those belonging to their respective owners, are vested in and the property of the applicants. The applicants retain and reserve all rights in their trademarks and copyrights included herein, and grant permission to reproduce the material only in connection with reproduction of the granted patent and for no other purpose.

Furthermore, the drawings may contain text or captions that may explain certain embodiments of the present disclosure. This text is included for illustrative, non-limiting, explanatory purposes of certain embodiments detailed in the present disclosure.

DETAIL DESCRIPTIONS OF THE INVENTION

Figure 1:
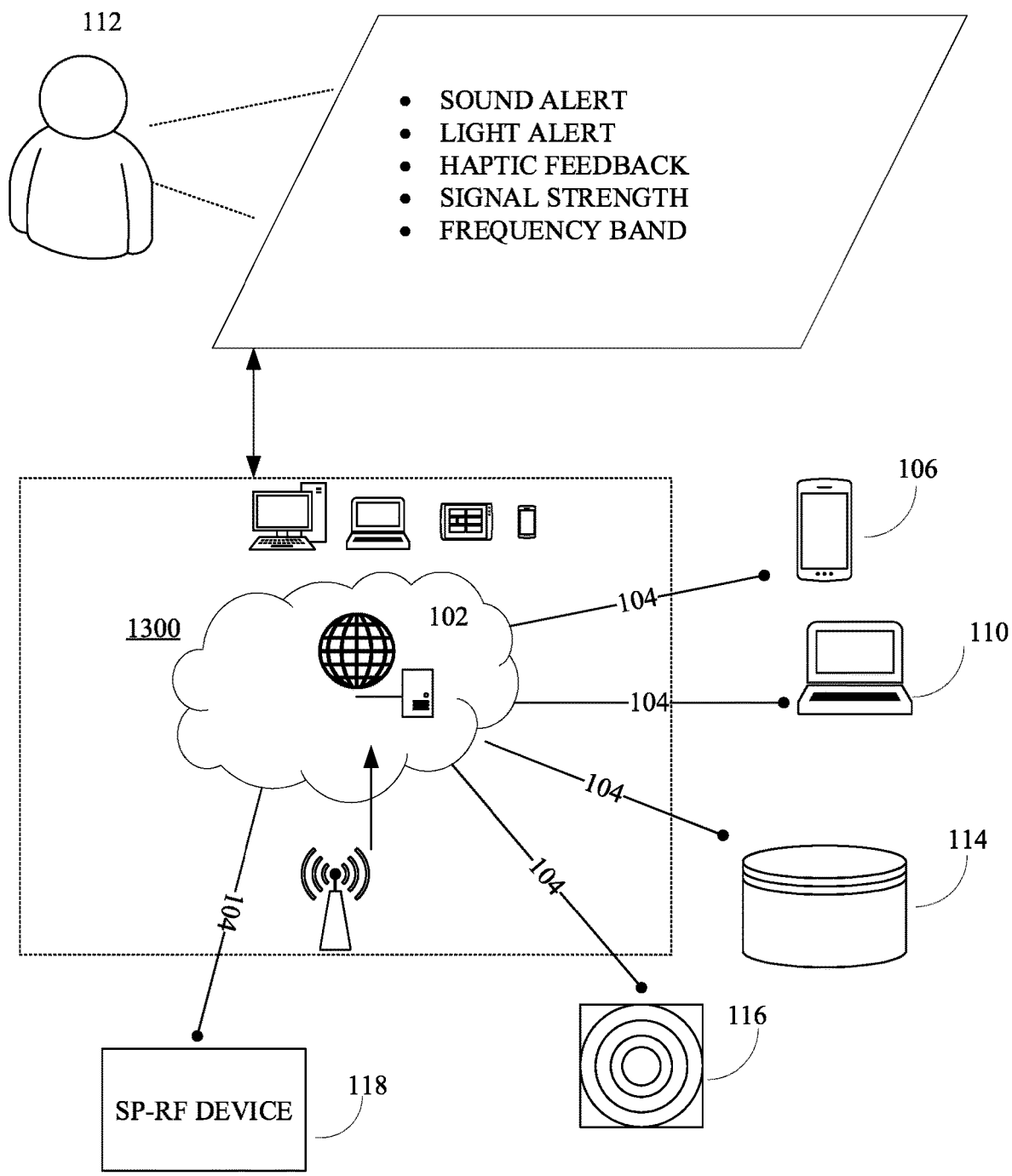
FIG. 1 is an illustration of an online platform consistent with various embodiments of the present disclosure.

As a preliminary matter, it will readily be understood by one having ordinary skill in the relevant art that the present disclosure has broad utility and application. As should be understood, any embodiment may incorporate only one or a plurality of the above-disclosed aspects of the disclosure and may further incorporate only one or a plurality of the above-disclosed features. Furthermore, any embodiment discussed and identified as being "preferred" is considered to be part of a best mode contemplated for carrying out the embodiments of the present disclosure. Other embodiments also may be discussed for additional illustrative purposes in providing a full and enabling disclosure. Moreover, many embodiments, such as adaptations, variations, modifications, and equivalent arrangements, will be implicitly disclosed by the embodiments described herein and fall within the scope of the present disclosure.

Accordingly, while embodiments are described herein in detail in relation to one or more embodiments, it is to be understood that this disclosure is illustrative and exemplary of the present disclosure, and are made merely for the purposes of providing a full and enabling disclosure. The detailed disclosure herein of one or more embodiments is not intended, nor is to be construed, to limit the scope of patent protection afforded in any claim of a patent issuing here from, which scope is to be defined by the claims and the equivalents thereof. It is not intended that the scope of patent protection be defined by reading into any claim a limitation found herein that does not explicitly appear in the claim itself.

Thus, for example, any sequence(s) and/or temporal order of steps of various processes or methods that are described herein are illustrative and not restrictive. Accordingly, it should be understood that, although steps of various processes or methods may be shown and described as being in a sequence or temporal order, the steps of any such processes or methods are not limited to being carried out in any particular sequence or order, absent an indication otherwise. Indeed, the steps in such processes or methods generally may be carried out in various different sequences and orders while still falling within the scope of the present invention. Accordingly, it is intended that the scope of patent protection is to be defined by the issued claim(s) rather than the description set forth herein.

Additionally, it is important to note that each term used herein refers to that which an ordinary artisan would understand such term to mean based on the contextual use of such term herein. To the extent that the meaning of a term used herein—as understood by the ordinary artisan based on the contextual use of such term—differs in any way from any particular dictionary definition of such term, it is intended that the meaning of the term as understood by the ordinary artisan should prevail.

Furthermore, it is important to note that, as used herein, "a" and "an" each generally denotes "at least one," but does not exclude a plurality unless the contextual use dictates otherwise. When used herein to join a list of items, "or" denotes "at least one of the items," but does not exclude a plurality of items of the list. Finally, when used herein to join a list of items, "and" denotes "all of the items of the list."

The following detailed description refers to the accompanying drawings. Wherever possible, the same reference numbers are used in the drawings and the following description to refer to the same or similar elements. While many embodiments of the disclosure may be described, modifications, adaptations, and other implementations are possible. For example, substitutions, additions, or modifications may be made to the elements illustrated in the drawings, and the methods described herein may be modified by substituting, reordering, or adding stages to the disclosed methods. Accordingly, the following detailed description does not limit the disclosure. Instead, the proper scope of the disclosure is defined by the appended claims. The present disclosure contains headers. It should be understood that these headers are used as references and are not to be construed as limiting upon the subjected matter disclosed under the header.

The present disclosure includes many aspects and features. Moreover, while many aspects and features relate to, and are described in the context of systems and methods to facilitate detecting an electromagnetic radiation in a space by using a self-powered radio frequency device (SP-RF device), embodiments of the present disclosure are not limited to use only in this context.

Overview:

An SP-RF LED, in an instance, may be a self-powered LED lamp beacon device that may indicate and/or locate a presence of a strong RF Energy and/or even "High voltage power line", from LF/HF/VHF/UHF up to microwave bands if the SP-RF LED may be in near/close proximity of a radiating element and/or antenna.

Further, the present disclosure, in an instance, may include a device that may be self-powered and/or with no critical semiconductors delicate of too much RF exposure. Further, the device, in an instance, may be self-powered, no critical semiconductor, micro compact in size, and/or cheap to make.

As stated above, the SP-RF LED may be a self-powered LED lamp beacon device that may indicate and/or locate the presence of a strong RF Energy and/or even "High voltage power line", from LF/HF/VHF/UHF up to microwave bands if the SP-RF device may be in near/close proximity of a radiating element or antenna. Further, the device claimed here may solve this problem.

Figure 11:
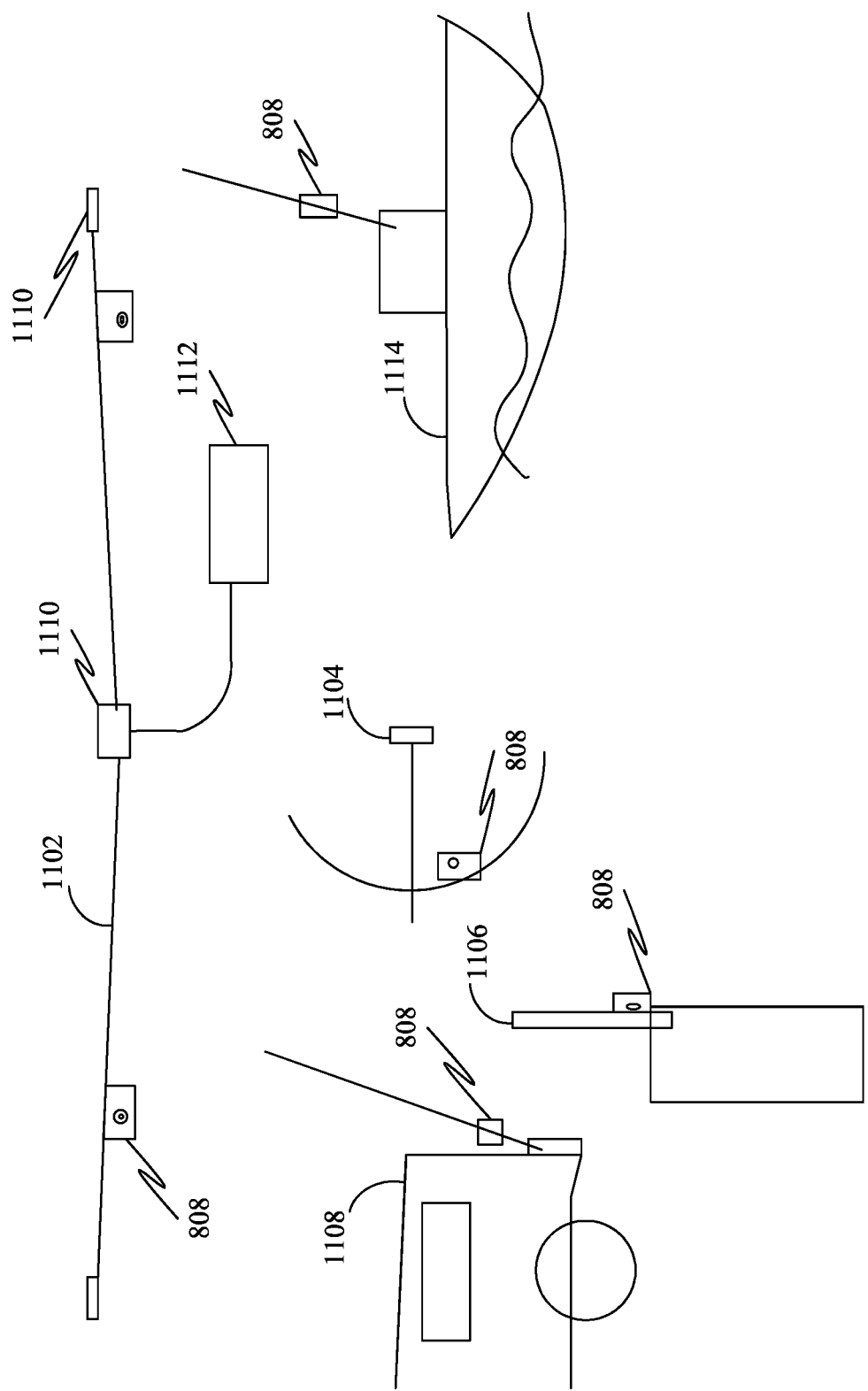
FIG. 11 shows a diagram representation of SP-RF devices that may be mounted on one or more antennas that may be placed on a military vehicle, and/or a marine vehicle, in accordance with some embodiments.
Figure 12:
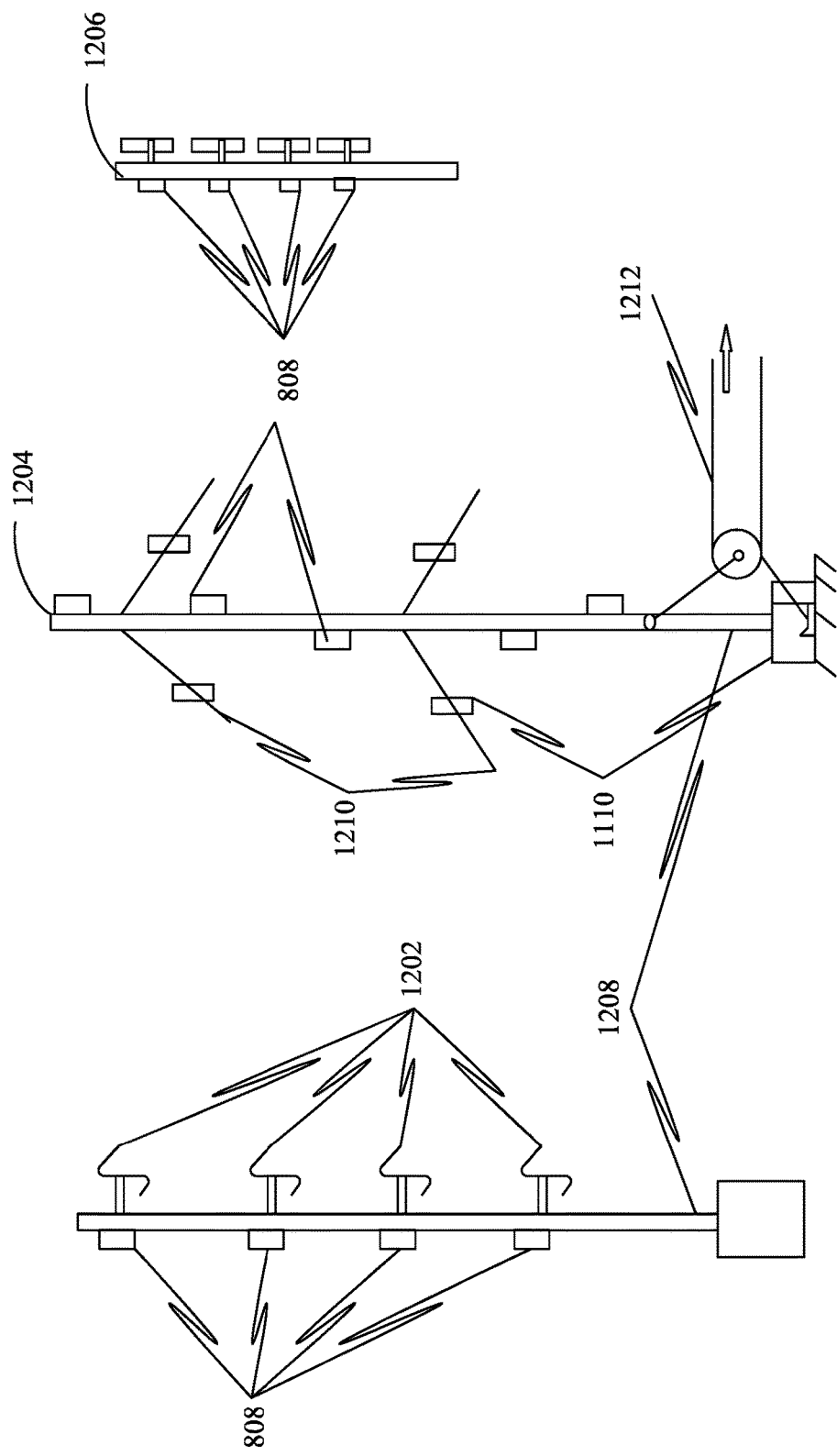
FIG. 12 shows a diagram representation of an SP-RF device that may be mounted on one or more antennas, in accordance with some embodiments.

Further, the device, in an instance, may function as a transmitter beacon lamp for AM/FM towers (as shown in FIG. 12) making sure that each element may output an RF. Further, the device, in an instance, may function as a radio repeater site antenna transmit indicators, and/or an aircraft radio antenna testing device. Further, the device, in an instance, may be installed inside antenna duplexers/combiners as transmit indicators (as shown in FIG. 11), military combat radios. Further, the device, in an instance, may function as a self-check indicator (such as if a radio has an RF output then an LED may light even at a time when not having a "radio check" test). Further, the device, in an instance, may function as a "Power Grid/High Voltage lamp beacon". Further, as power grid lamp marker, the device may be used for low flying aircraft avoidance, visible at night.

Further, the device, in an instance, may differ from what currently exists. The device, in an instance, may be self-powered, maintenance free and/or straightforward in design, and/or easy to use.

Further, the device, in an instance, may be self-powered, no critical semiconductor, micro compact in size, and/or cheap to make.

Further, the device, in an instance, may be integrated in broadcast antennas (TV, AM, FM, SW) as lamp beacons, cell site antenna beacons, security detection, antenna tower testing device, military radios test set, repeater site test device, electricians test device, electronic/communication technician & engineers test device. Further, the device, in an instance, may be designed in any shape, cylindrical, square box such as a wall wart charger, ball pen type. Further, a circuit of the device, in an instance, may include a one or more pickup elements (such as #1, 2 & 3) that may also be connected directly to an RF and/or HV source without damaging the circuit due to a function of a Zener diode (Z1) that may protect the LED from overvoltage.

Further, the device, in an instance, may include an LED light and/or lights LED1, LED2, a Zener diode (Z1), one or more diodes (D1, D2, D3, D4), an RF Pick-up Element (such as RF pickup element 1, 2, & 3), one or more ferrite inductors (such as L1, and L2).

Further, The RF pickup element 1, in an instance, may be a main RF detection point connected to the one or more diodes (D1, D2, D3, & D4) with D1 & D2 and D3 & D4 has a special detection function. Further, the D1 & D2, in an instance, may detect lower frequencies from kilohertz up to few hundred megahertz (around 150 MHz) with good sensitivity, while D3 & D4, in an instance, may have a good sensitivity for up to Gigahertz due to microwave characteristic of a diode. Further, combining the D1, D2, D3 & D4, in an instance, may make the circuit of the device becoming broadband from kilohertz to gigahertz detection. Further, the L1 and/or L2, in an instance, may protect and/or isolate DC voltage on an LED side and/or may block the LED from any AC RF signal interference detected by the diode (D1 to D4). Further, the Zener diode (Z1), in an instance, may also protect the LED and/or the circuit from an overload due to a strong RF power that may be present in a surrounding of the device.

Further, The RF pickup element 1, in an instance, may serve as a main RF detector element that would make the circuit function as a self-powered RF detection that may lights/monitor even without the counterpoise RF pickup element 2 & 3. Further, the RF pickup element—2 and 3, in an instance, may be optional if the device may be used in a higher RF power transmitter (kilowatts) like AM/FM/TV broadcast antenna monitoring. Further, the RF pickup element—2 and 3, in an instance, may be configured in different shape and/or style inside an enclosure that may include coil shape, spiral, square, triangular, dipole etc.

Further, the two LEDs (LED1 and LED2), in an instance, may also be optional. Further, one LED, in an instance, may be enough if a plastic box enclosure does not have enough space. Further, a protection circuit may also be used with Zener diode (Z1) that may limit a maximum voltage input to the LED around 2.4 volts maximum for each LED.

Although, a current during the test may be measured to be around 15 to 20 milliamps, the L1 and/or L2 may also be an important component that may function as an RF filter or RF trap. Further, the L1 and/or L2, in an instance, may block the RF and/or may isolate any AC RF voltage going to the LED and/or may protect the LED from erratic RF transmission.

Further, since the RF signal radio transmission may be AC in nature, the diodes D1-D4 (small signal fast switching diodes+microwave diodes) may act as detector and/or dc converter, converting an energy collected from the RF element 1, 2, & 3 and/or may complete the circuit, enough to power one or more LED (that may be connected in series at 2.5 to 3 volts DC at 10-20 mA). Further, the LEDs, in an instance, may be added if there may be an additional circuit (such as 2, 4, and/or 10 LED's). Further, in a high voltage line application, the RF pickup element #1, 2, & 3 may function as corona effect pick up element, but the RF pickup element may be a little longer (the RF pickup Element #1 may be one foot to three feet, with counterpoise) installed in parallel and/or closer to an HV transmission line. Further, most RF and/or radio antenna may be vertically oriented. The RF pickup element #1 and #2 may function as a dipole collector, and/or one of the other as a counterpoise. Further, the RF pickup Element #3, in an instance, may capture a signal in horizontal and/or non-vertical since the RF pickup Element #3 may be spiral and/or combination of horizontal & vertical. Further, the device, in an instance, may be simulated with a test using High voltage from TV fly-back circuit around 25 KV.

Further, the device, in an instance, may be tested in many RF bands in LF/HF/VHF/UHF/Microwave, and the light may glow from minute 200 mW handheld transceiver VHF/UHF/800 MHZ, WI-FI router, to 1-kilowatt HF transmitter in RF environment. Further, the device, in an instance, may be simulated with a Power grid/HV power line by powering a TV flyback around 25 KV, and the same results may be observed (the LED glows).

Further, the circuit of the device, in an instance, may be disposed and/or embedded inside an ABS sealed plastic protective enclosure. Further, the RF pickup element #1 and #2& #3, in an instance, may work from inside the enclosure box. Further, an optional element pick up terminal, in an instance, may be installed outside the enclosure box for better RF and/or HV pick-up for brighter LED illumination. Further, the device, in an instance, may be tested with (more than) six (6) LED in parallel and the LED may light when the RF may be stronger.

Further, as long as the LED 1 may be connected in series and/or in parallel with a diode, a pickup element may be connected in both sides of a diode (cathode and anode). Further, the circuit, in an instance, may be complete and/or may light up the LED. Further, added diodes, in an instance, may enhance a glow/illumination.

Further, the device, in an instance, may be installed near and/or close proximity (such as 1 to 5 feet) from a radiating element of broadcast station antenna as antenna RF monitor beacon for TV, AM, FM, Shortwave, Cell site antennas, repeaters, microwave, Radars or any RF transmitters that may require visual light monitoring.

Further, the device, in an instance, may be used by radio technician and/or installers. Further, a person, in an instance, may use the device to locate the antenna in vehicle/mobile roof (Easy to locate what antenna matches the radio especially in Police/Sheriff and Fire vehicles during repair roll-ups).

Further, the circuit of the device, in an instance, may be installed and/or integrated as a new design for radio antenna duplexers and combiners for repeaters and trunking radio system, cell site combiners.

Further, the device, in an instance, may be integrated as a part of a maintenance checklist to test the antenna functionality, as a light may indicate if an aircraft has enough and/or working transmitter output in the antenna without calling someone for a radio check. Further, there may be causes of transmitter failures (such as defective transmitter component, defective connector, defective transmission cable, defective antenna mounting (corrosion)). Further, a mechanic, in an instance, may visually test the antenna if the device may be installed near the antenna Further, the device, in an instance, may be used for a military manpack radio. A user may be able to check if a transmitter may have an output in the antenna stage when keyed. Before a soldier may be deployed, the device may be used as a quick-checker periodically. If the device doesn't light, the radio may have no transmit output.

Further, the device may also be used by FCC enforcer and/or others to locate a jamming illegal transmitter causing interference to other users. Further, a drone, in an instance, may carry the device and/or may hover near suspect's antenna and the bright LED may illuminate. Further, the device, in an instance, may also be used to detect and/or troubleshoot a high voltage power line and transformers as long as a source has enough corona effect. Further, in future, the device may also be used in EMF warfare detection (another military application). Further, an early alert system may also be given to any user, embedded inside clothes and/or devices to notify the user that EMF energy may be present. Further, the device may be installed outside walls and/or inside buildings, vehicles, body clothing etc.

Further, the device, in an instance, may be made as small as a tip of a pencil eraser using SMD components.

Further, the device may be integrated into broadcast antennas (TV, AM, FM, SW) as lamp beacons, cell site antenna beacons, security detection, antenna tower testing device, military radios test set, repeater site test device, electricians test device, electronic/communication technician & engineers test device. Further, the circuit may be designed in any shape, cylindrical, square box such as a wall wart charger, ballpen type, the RF pickup element #1, 2 & 3 may also be connected directly to an RF or HV source without damaging the circuit due to a single input.

Further, the device that may detect Radio Frequency energy, powering LED lamp as indicating beacon is disclosed. Further, the device, in an instance, may be self-powered, rugged, weatherproof, no critical semiconductor, micro compact in size, cheap to make.

FIG. 1 is an illustration of an online platform 100 consistent with various embodiments of the present disclosure. By way of non-limiting example, the online platform 100 to facilitate detecting an electromagnetic radiation in a space by using a self-powered radio frequency device (SP-RF device) may be hosted on a centralized server 102, such as, for example, a cloud computing service. The centralized server 102 may communicate with other network entities, such as, for example, a mobile device 106 (such as a smartphone, a laptop, a tablet computer etc.), other electronic devices 110 (such as desktop computers, server computers etc.), databases 114, sensors 116, electromechanical systems (not shown) and a SP-RF device 118 over a communication network 104, such as, but not limited to, the Internet. Further, users of the online platform 100 may include relevant parties such as, but not limited to, end users, field technicians, and administrators. Accordingly, in some instances, electronic devices operated by the one or more relevant parties may be in communication with the online platform 100.

A user 112, such as the one or more relevant parties, may access the online platform 100 through a web based software application or browser. The web based software application may be embodied as, for example, but not be limited to, a website, a web application, a desktop application, and a mobile application compatible with a computing device 1300.

Figure 2:
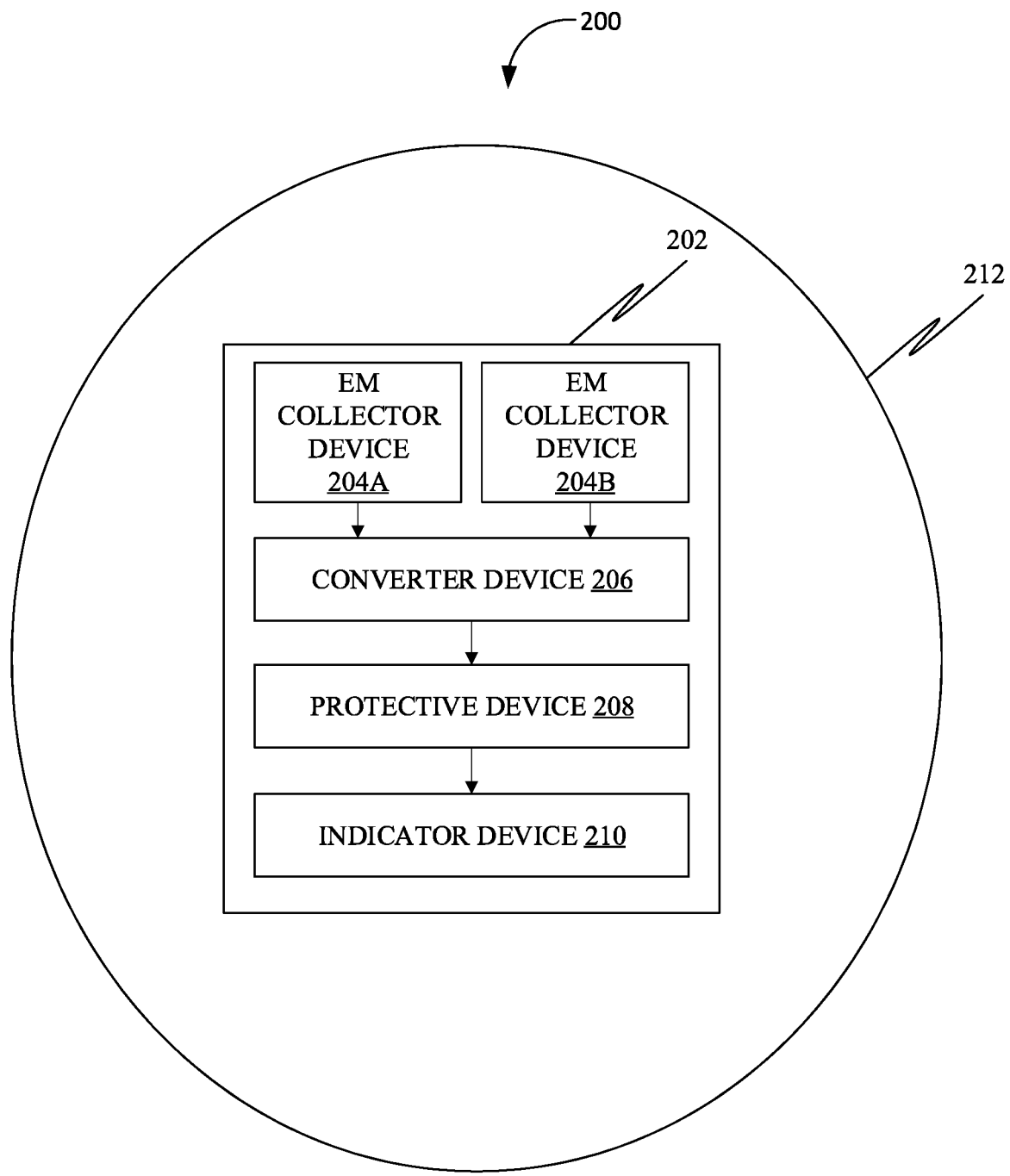
FIG. 2 illustrates a block diagram representation of a system to facilitate detecting an electromagnetic radiation in a space by using a self-powered radio frequency device (SP-RF device), in accordance with some embodiments.

FIG. 2 illustrates a block diagram representation of a system 200 to facilitate detecting an electromagnetic radiation in a space 212 by using a self-powered radio frequency device (SP-RF device) 202, in accordance with some embodiment. Accordingly, the system 200, in an instance, may include a self-powered radio frequency device 202 (SP-RF device). The SP-RF device 202, in an instance, may be an electronic device that may be configured to detect an electromagnetic radiation of one or more frequencies in a space 212. Further, the electromagnetic radiations, in an instance, may include radio waves, microwaves, infrared etc. based on the one or more frequencies. The one or more frequencies, in an instance, may include, but not limited to, low frequencies (LF), high frequencies (HF), very high frequencies (VHF), ultra-high frequencies (UHF), and/or microwave frequencies etc. Further, the space 212, in an instance, may be any region where a user may wish to detect the electromagnetic radiation of one or more frequencies. The space 212, in an instance, may include, but not limited to, a radiating element, an antenna, a TV broadcasting facility, an aircraft antenna, a cellular antenna, a high voltage power line etc.

Further, the SP-RF device 202, in an instance, may include a plurality of EM collector devices 204 (such as EM collector device 204A and 204B, as illustrated in FIG. 2). The EM collector device 204, in an instance, may be a wireless receiver that may be configured to collect an electromagnetic energy from the electromagnetic radiation that may be present in the space 212. Further, the plurality of EM collector devices 204, in an instance, may include one or more RF pickup elements that may be electrically coupled with a converter device 206. Further, the one or more RF pickup elements, in an instance, may be configured to collect the electromagnetic energy of a plurality of frequency bands (such as an LF band, an HF band, a VHF band, a UHF band, and/or a microwave frequency band etc.). For instance, a first RF pickup element may be configured to collect the electromagnetic energy of one frequency band (such as LF band) and a second RF pickup element may be configured to collect the electromagnetic energy of another frequency band (such as VHF and/or UHF band for TV broadcasting). Further, in some embodiments, the first RF pickup element may be configured to collect the electromagnetic energy of a wide range of frequencies that may be used by the converter device 206 to energize the SP-RF device 202. Whereas, the second RF pickup element may be configured and/or tuned in a way to collect the electromagnetic energy of a desired frequency that the user may wish to detect. Further, each of the RF pickup element, in an instance, may be configured in different shape and/or style (such as coil shape, spiral shape, square, triangular, dipole etc.) for collecting the electromagnetic energy of different frequency bands.

Further, in some embodiments, the user may provide a characteristic of the electromagnetic radiation for which the user may wish to detect a presence in the space 212. The characteristic of the electromagnetic (EM) radiation, in an instance, may be any feature and/or parameter associated with the EM radiation that may reflect something of interest with regard to the EM radiation that the user may wish to detect. Further, the characteristic of the EM radiation, in an instance, may include a frequency band, an amplitude, an apparatus type that may be radiating the EM radiations etc. Further, the user, in an instance, may provide the characteristics of the EM radiation to the online platform 100 through a user device. The user device, in an instance, may be any IoT based device that may be configured to communicate with the online platform 100. Further, the user device, in an instance, may include, but not limited to, a mobile phone, a smartwatch, a laptop, a PC etc. Further, the SP-RF device 202, in an instance, may be configured to automatically tune the RF pickup element based on the characteristics of the EM radiation that may be received by the online platform from the user through the user device. For instance, the SP-RF device 202 may tune the RF pickup element to detect the presence of the EM radiation near a Wi-Fi router by using the characteristic of the EM radiation (such as a type of the Wi-Fi router, frequency band associated with the Wi-Fi router etc.) that may be provided by the user through the user device.

Further, the converter device 206, in an instance, may be an electrical device that may be configured to convert the electromagnetic energy collected by the EM collector device 204 into an electrical energy that may be used as a power source for the SP-RF device 202. Further, the converter device 206, in an instance, may comprise of one or more diodes. Further, the one or more diodes, in an instance, may be semiconductor devices that may convert the electromagnetic energy collected from the RF pickup element by allowing a current to flow through the diode. Further, the one or more diodes, in an instance, may include, but not limited to, small signal fast switching diodes, and/or microwave diodes etc. Further, the small signal fast switching diode, in an instance, may be fast switching Schottky diode such as 1N4148 diode, and/or equivalent that may convert the electromagnetic energy with a frequency ranging from 500 KHz to 100 MHz. Further, the microwave diodes, in an instance, may be a microwave RF Schottky detector diode that may convert the electromagnetic energy with frequency ranging from VHF (and/or UHF) to 10 GHz. Further, the converter device 206, in some embodiments, may not be based on a semiconductor technology and/or may be based on other alike technologies. Further, the electrical energy from the converter device 206, in an instance, may be used to supply an electrical signal to an indicator device 210. The indicator device 210, in an instance, may be an electrical device that may be configured to indicate a presence of the electromagnetic radiation in the space 212. The indicator device 210, in an instance, may comprise of, but not limited to, one or more LEDs, and/or one or more speakers etc. Further, the one or more LEDs, in an instance, may illuminate with a bright intensity that may indicate the user about the presence of the electromagnetic radiation in the space 212. Further, the one or more LEDs, in an instance, may be electrically connected in series and/or in parallel combination in a way such that the one or more LEDs may operate at a rated voltage and/or current magnitude (such as 3 volts and 15 mA, and/or 2.5 volts and 20 mA etc.). Further, the one or more LEDs, in an instance, may be of different colors (such as green, red, blue, yellow etc.) in order to indicate the presence of various electromagnetic radiations of different frequency bands. For instance, the LED may illuminate a red color when the electromagnetic radiation of UHF band (such as 400 MHz, 500 MHz etc.) may be collected by the RF pickup element, whereas, the LED may illuminate a blue color when the electromagnetic radiation of LF band (such as 250 KHz etc.) may be collected by the RF pickup element. Further, in some embodiments, the one or more LEDs, in an instance, may be of different colors (such as green, red, blue, yellow etc.) with varied luminance intensity in order to indicate a signal strength of the electromagnetic radiations that may be present in the space 212. Further, the signal strength, in an instance, may represent an intensity and/or magnitude of the EM radiation that may be present in the space 212. For instance, the LED may illuminate a bright red color when the electromagnetic radiation may be having a stronger signal strength, whereas, the LED may illuminate a blue color (and/or a low intensity red color) when the electromagnetic radiation may have a weak signal strength in the space 212. Further, in another embodiment, the signal strength of the EM radiation may be indicated by a number of LEDs that may be illuminated at a time by the indicator device 210. A higher number of LED illumination may commensurate a stronger signal strength. For instance, the indicator device 210 of the SP-RF device 202 may comprise of five number of LEDs and/or may illuminate the number of LEDs in proportion to the signal strength of the EM radiation. Further, in the aforementioned example, the indicator device 210 may illuminate all (five) LEDs for stronger signal strength (when the SP-RF device 202 may be placed in close proximity to the radiating element) and/or may illuminate only one (out of five) LED for a poor signal strength (when the SP-RF device 202 may be placed very far away from the radiating element).

Further, the indicator device 210, in some embodiments, may include elements that may not be based on a semiconductor-based technology. For instance, the indicator device 210, in an instance, may include a highly conductive carbon nanotube that may be configured to evenly distribute an illumination with a low power consumption and/or a high efficiency.

Further, the indicator device 210, in an instance, may include one or more speakers. The one or more speakers, in an instance, may provide an alarm sound and/or chime by using the electrical energy generated by the converter device 206 when the electromagnetic radiation may be detected by the EM collector device 204. Further, the one or more speakers, in an instance, may be electrically connected in series and/or in parallel combination in a way such that the one or more speakers may operate at a rated voltage and/or current magnitude. Further, in some embodiments, a volume of the alarm sound and/or chime by the one or more speakers may be adjusted by the indicator device 210 based on the signal strength of the EM radiation that may be present in the space 212. For instance, a high volume of the alarm sound and/or chime may be produced by the one or more speakers when the signal strength of the EM radiation collected by the RF pickup element may be strong (when the SP-RF device 202 may be placed in close proximity to the radiating element).

Further, in another embodiment, the indicator device 210, in an instance, may include a vibrating mechanism. The vibrating mechanism, in an instance, may provide a haptic feedback to the user when a strong electromagnetic radiation may be collected by the one or more RF pickup element of the EM collector device 204. Further, the vibrating mechanism, in an instance, may include, but not limited to, a vibrating motor, a taptic engine etc. Further, the haptic feedback provided by the vibrating mechanism, in an instance, may be of varying intensity that may commensurate with the signal strength of the EM radiation that may be present in the space 212.

Further, the SP-RF device 202, in an instance, may include a protective device 208. The protective device 208, in an instance, may be an electrical device configured to protect the SP-RF device 202 from any abnormal condition such as an overvoltage, and/or an overcurrent etc. Further, the protective device 208, in one embodiment, may include a voltage clipper, and/or a current limiter. The voltage clipper, in an instance, may regulate a voltage level across the indicator device 210 (such as the LED, the speaker, and/or the vibrating mechanism etc.) in a way such that the voltage level may not cross a value that may damage the indicator device 210 and/or may jeopardize the SP-RF device 202. Further, the voltage clipper, in an instance, may include, but not limited to, one or more zener diodes. The zener diode, in an instance, may be a p-n junction semiconductor diode that may be configured to maintain a voltage level across the indicator device 210. Further, the zener diode, in an instance, may be serially connected with a connection jumper. The connection jumper, in one embodiment, may be a manual switch that may be turned on and/or off by the user to electrically connect and/or disconnect the zener diode from other components of the SP-RF device 202. Further, the connection jumper, in another embodiment, may be an automatic switch that may be turned on and/or off automatically by the system 200 to include and/or exclude the zener diode from the system 200 based on a data received from a voltage sensor. Further, the voltage sensor, in an instance, may be configured to provide a real-time voltage level to the connection jumper that may electrically connect the zener diode with the indicator device 210 when the voltage level may be higher than a threshold value. For instance, for the SP-RF device 202 with the indicator device 210 (such as the LED with 3 volt rating) may observe (through the voltage sensor) a sudden voltage surge of more than the threshold value (such as 3.8 volts), then the connection jumper may electrically connect the zener diode across the indicator device 210 to regulate the voltage level up to 3 volts.

Further, the current limiter, in an instance, may be a device that may be configured to restrict and/or limit a current level such that the indicator device 210 (such as the LED, the speaker, and/or the vibrating mechanism etc.) may operate properly. Further, the current limiter, in an instance, may include but not limited to, one or more ferrite inductors. Further, the one or more ferrite inductors, in an instance, may be an electrical inductor that may be configured to oppose a sudden change in a current that may be passing through the indicator device 210. Further, the one or more ferrite inductors, in an instance, may function as an RF filter that may block and/or isolate any AC RF current going to the LED and/or may protect the LED from an erratic RF transmission.

Further, the SP-RF device 202, in some embodiments, may be designed in a shape that may be compact, portable, and/or mobile etc. Further, the shape, in an instance, may include, but not limited to, spherical, square, rectangular, conical etc. Further, the SP-RF device 202, in some embodiments, may be designed with the shape that may be as compact as a tip of a pencil eraser by using SMD (surface-mount device) components.

Figure 10:
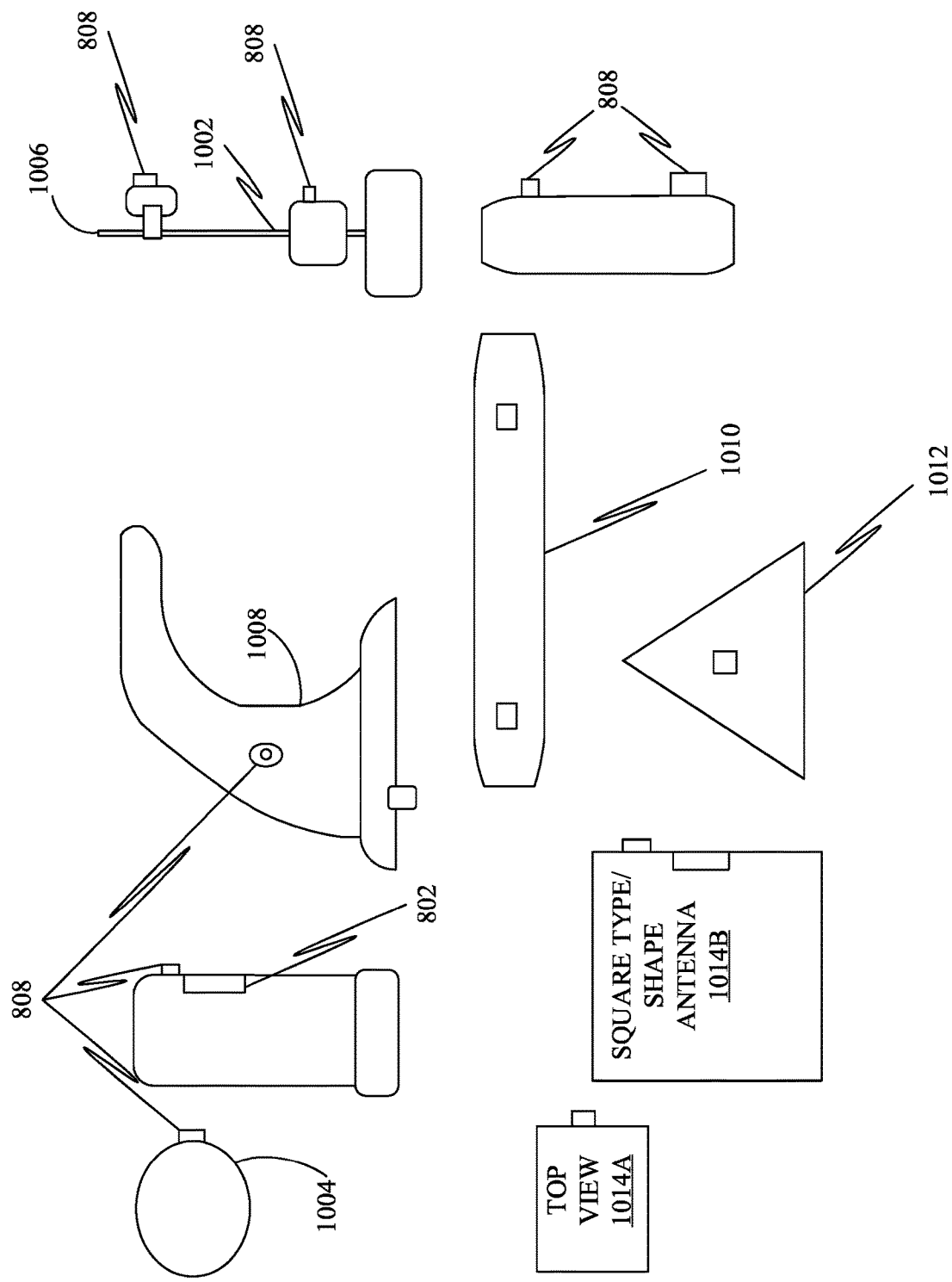
FIG. 10 shows a diagram representation of SP-RF devices that may be mounted on one or more antennas that may be designed with a different shape, in accordance with some embodiments.

Further, the SP-RF device 202, in some embodiments, may be configured to be disposed and/or attached on one or more objects. Further, the one or more objects, in an instance, may include, but not limited to, cloths, vehicles, walls, antennas, towers, aircraft, helicopters, VHF/UHF/800 MHz/1.2 GHz mobile antennas 1004 (as shown in FIG. 10), marine radio etc. Further, the one or more objects, in an instance, may include antennas such as a VHF/UHF aviation blade antenna 1008, a mobile VHF/UHF antenna 1006 (along with the LED 808, and/or a whip element 1002, as shown in FIG. 10), rectangular shape antenna 1010, triangular shape antenna 1012, square type/shape antenna 1014B (along with a top view 1014A, as shown in the FIG. 10), a HF diploma antenna 1-30 MHz 1102 (along with an insulator 1110 and/or a HF radio transceiver 1112, as shown in FIG. 11), microwave dish antenna 1104, a handheld transceiver radio antenna 1106, a military HF mobile antenna 1108, circular polarity antennas 1202 (along with a tower mast 1208, as shown in FIG. 12), transmitter antenna tower 1204 (along with guy wires 1210 and/or a transmitter coaxial cable 1212, as shown in FIG. 12), VHF/UHF/800 MHz radio base/repeater antenna 1206 etc.

Figure 9:
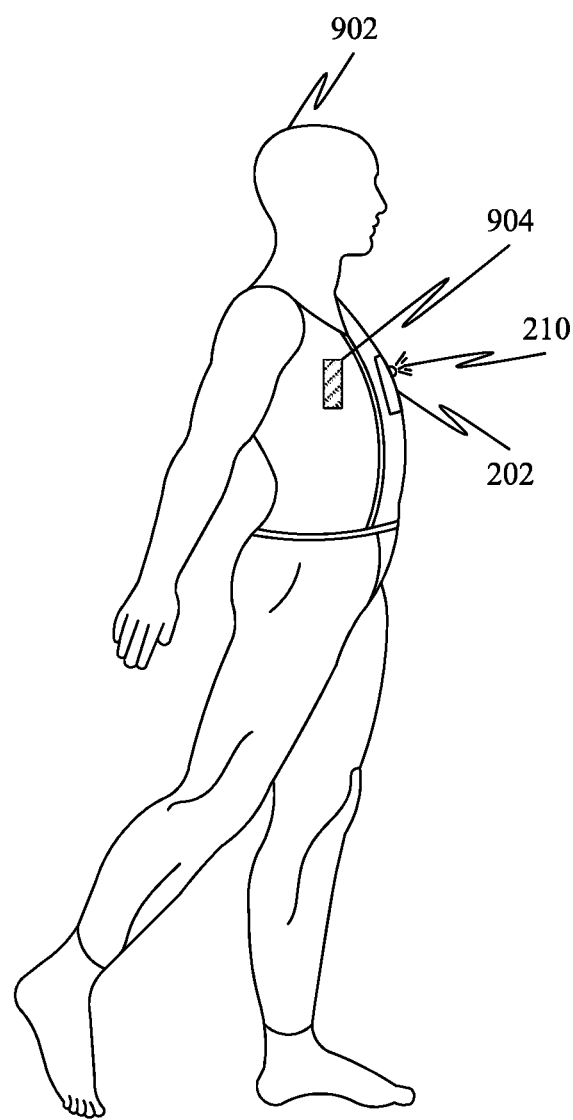
FIG. 9 illustrates a user that may be using a cardiac pacemaker and/or may be wearing cloth that may be equipped with the SP-RF device, in accordance with some embodiments.

Further, the SP-RF device 202, in an instance, may comprise of an adhesive layer and/or other attachment means (e.g. hook fastener, Velcro fastener, nut/bolt, magnetic fastener etc.) to enable placement of the SP-RF device 202 on the one or more objects. For instance, the SP-RF device 202 may be placed on the cloths of the user by using the Velcro fastener. Further, the user, in an instance, may be using a cardiac pacemaker and/or may be adversely affected by an exposure of the strong EM radiations on the user (as shown in FIG. 9). Further, the user, in an instance, may be able to attach and/or remove the SP-RF device 202 from the cloths easily. Further, the SP-RF device 202, in an instance, may provide an alarm and/or chime sound from the one or more speakers of the indicator device 210 when the user may be exposed to the strong electromagnetic radiation that may be detrimental to the user's health.

Figure 3:
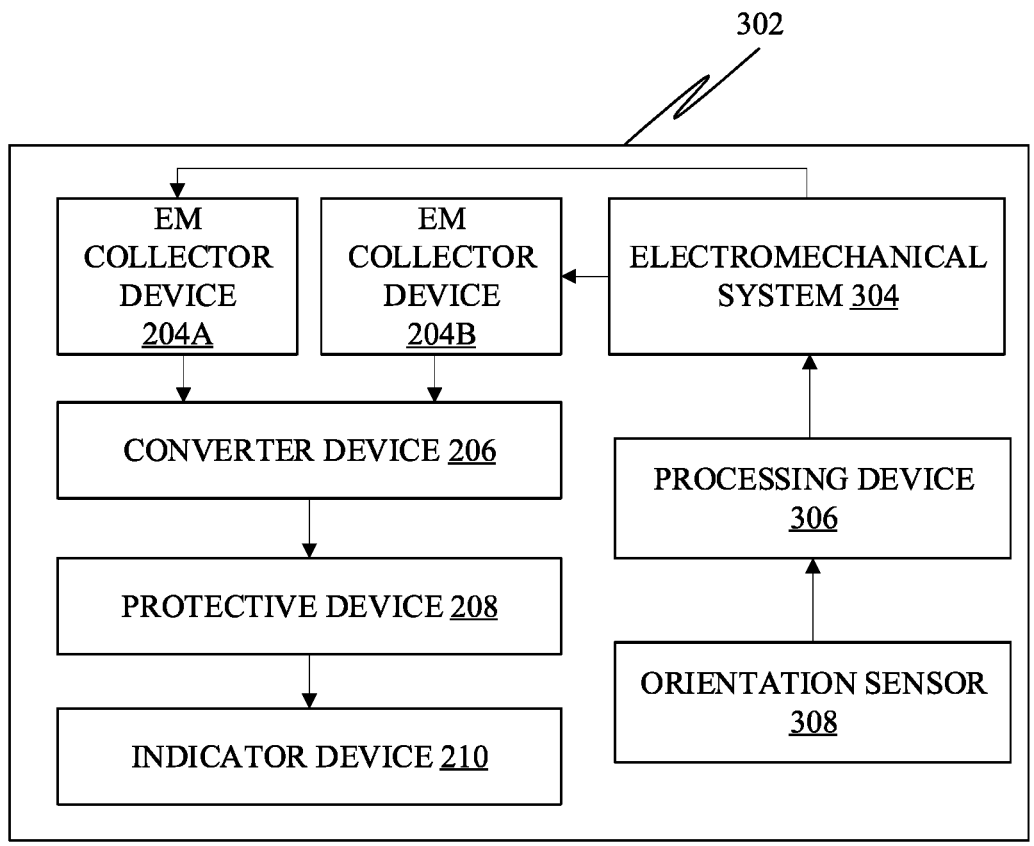
FIG. 3 illustrates a block diagram representation of an SP-RF device that may be configured to orient the one or more RF pickup element in a way such that a maximum electromagnetic radiation may be collected from the space, in accordance with some embodiments.

FIG. 3 illustrates a block diagram representation of an SP-RF device 302 that may be configured to orient the one or more RF pickup element in a way such that a maximum electromagnetic radiation may be collected from the space 212 (as shown in FIG. 2), in accordance with some embodiment. Further, the SP-RF device 302, in some embodiments, may comprise of an orientation sensor 308. The orientation sensor 308 may be configured to detect an orientation of the SP-RF device 302 in relation to the space 212. Further, the orientation sensor 308, in general, may be characterized as a sensor that may sense an angle of the SP-RF device 302 relative to a ground and/or a magnetic field direction. Further, the orientation sensor 308, in an instance, may measure an azimuthal, a pitch and/or a roll angle of the SP-RF device 302. The azimuthal, in an instance, may be an angle between a longitudinal axis of the SP-RF device 302 and the Earth's magnetic field. Further, the pitch, in an instance, may be the angle between a plane parallel to the ground and the plane of the SP-RF device 302. Further, the roll angle, in an instance, may be the angle formed by tilting the SP-RF device 302 left and/or right. Further, the SP-RF device 302, in an instance, may use a sensory data received from the orientation sensor 308 in order to identify a direction from where the maximum electromagnetic radiation may be collected by the one or more RF pickup elements of the EM collector device 204. The sensory data, in an instance, may be analyzed by a processing device 306. The processing device 306, in an instance, may be a device that may be configured to analyze the sensory data in order to determine the direction of the one or more RF pickup element. Further, the processing device 306, in an instance, may carry out a computer program by performing arithmetic, logical, and/or control operations for determining the direction of the one or more RF pickup element. Further, the processing device 306, in an instance, may generate an actuating signal that may be transmitted to an electromechanical system 304. The electromechanical system 304, in an instance, may be configured to change the direction of the one or more RF pickup element of the EM collector device 204. The electromechanical system 304, in an instance, may comprise of (but not limited to) a stepper motor that may be configured to move the one or more RF pickup element based on the actuating signal generated by the processing device 306.

Figure 4:
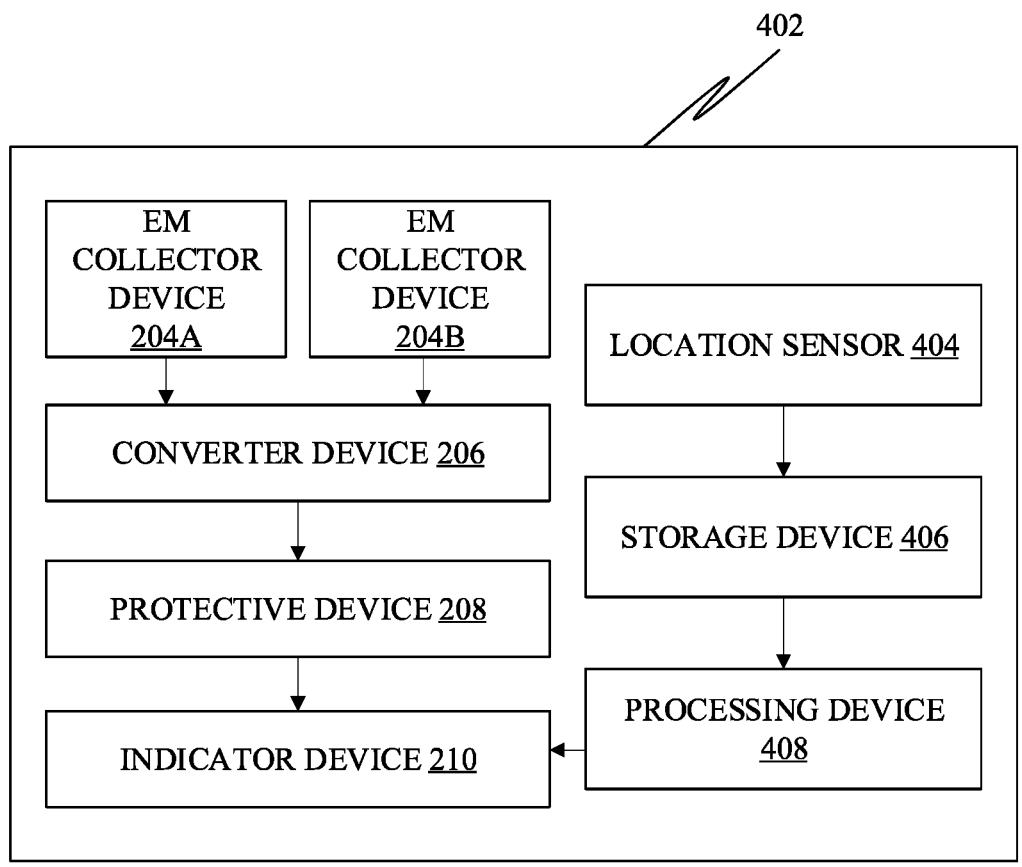
FIG. 4 illustrates a block diagram representation of an SP-RF device that may notify a user about a presence of the electromagnetic radiation in the space based on a location of the user, in accordance with some embodiments.

FIG. 4 illustrates a block diagram representation of an SP-RF device 402 that may notify a user about a presence of the electromagnetic radiation in the space 212 (as shown in FIG. 2) based on a location of the user, in accordance with some embodiment. Further, the SP-RF device 402, in some embodiments, may comprise of a location sensor 404. The location sensor 404, in an instance, may be configured to detect the location of the SP-RF device 402 in the space 212. Further, the location sensor 404, in an instance, may be a GPS sensor configured to sense a latitude and/or longitude coordinates of a location where the SP-RF device 402 may be present. Further, the latitude and/or longitude coordinates of the location, in an instance, may be stored by the SP-RF device 402 in a storage device 406 when a strong electromagnetic radiation may be detected by the SP-RF device 402 in the space 212. Further, the latitude and/or longitude coordinates stored in the storage device 406, in an instance, may be used by a processing device 408 of the SP-RF device 402 in order to notify and/or inform the user about the presence of the strong electromagnetic radiation in the space 212. The processing device 408, in an instance, may carry out a computer program by performing arithmetic, logical, and/or control operations for comparing a real-time latitudinal and/or longitudinal coordinates of the SP-RF device 402 with the latitudinal and/or longitudinal coordinates stored in the storage device 406. For instance, the SP-RF device 402 may inform the user (by activating the one or more LEDs and/or speakers of the indicator device 210) about the presence of the EM radiation in the space 212 by comparing (using the processing device 408) the real-time latitudinal and/or longitudinal coordinates of the SP-RF device 402 and the latitude and/or longitude coordinates (that may be stored in the storage device 406) of the location where the strong EM radiations may be observed earlier by the user through the SP-RF device 402.

Further, the SP-RF device 402, in some embodiments, may be configured to be disposed and/or attached on one or more objects. Further, the one or more objects, in an instance, may include, but not limited to, cloths, vehicles, walls, antennas, towers, aircraft, helicopters, mobile antennas, marine radio comm. 1114 (as shown in FIG. 11) etc. Further, the SP-RF device 402, in an instance, may comprise of an adhesive layer and/or other attachment means (e.g. hook fastener, Velcro fastener, nut/bolt, magnetic fastener etc.) to enable placement of the SP-RF device 402 on the one or more objects. For instance, the SP-RF device 402 may be placed on the cloths of the user by using the Velcro fastener. Further, the user, in an instance, may be using a cardiac pacemaker and/or may be adversely affected by an exposure of the strong EM radiations on the user. Further, the user, in an instance, may be able to attach and/or remove the SP-RF device 402 from the cloths easily. Further, the SP-RF device 402, in an instance, may provide an alarm and/or chime sound from the one or more speakers of the indicator device 210 when the user may be exposed to the strong electromagnetic radiation that may be detrimental to the user's health.

Figure 5:
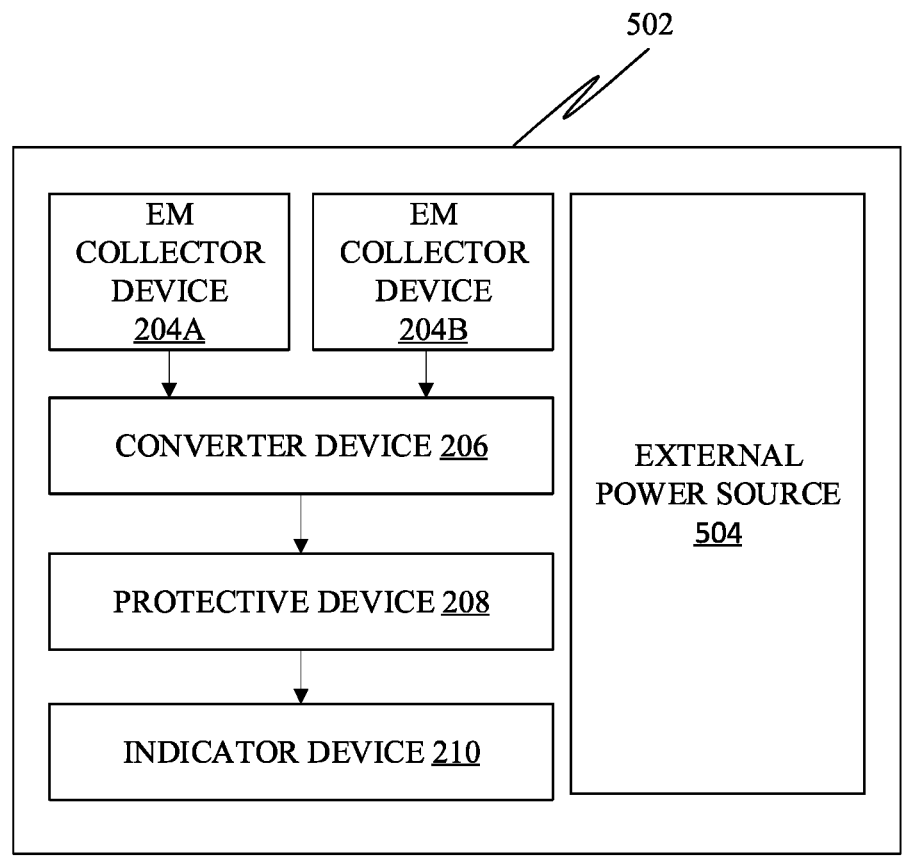
FIG. 5 illustrates a block diagram representation of an SP-RF device that may comprise of an external power source that may be configured to provide a required electrical energy to an electric component (such as an LED and/or a speaker of an indicator device etc.) of the SP-RF device, in accordance with some embodiments.

FIG. 5 illustrates a block diagram representation of a SP-RF device 502 that may comprise of an external power source 504 that may be configured to provide a required electrical energy to an electric component (such as the LED and/or the speaker of the indicator device 210 etc.) of the SP-RF device 502, in accordance with some embodiment. Further, the external power source 504, in one embodiment, may comprise of one or more batteries. The one or more batteries, in an instance, may convert a stored chemical energy into the electrical energy that may be used to energize the electrical components of the SP-RF device 502. Further, the one or more batteries, in an instance, may be rechargeable. Further, in another embodiment, the external power source 504, in an instance, may include a solar panel. The solar panel, in an instance, may convert a solar radiation from the sun into the electrical energy that may be used to energize the electrical components of the SP-RF device 502. Further, the electrical energy generated by the solar panel, in an instance, may be stored in the one or more batteries that may be disposed within the external power source 504. Further, the external power source 504, in an instance, may be covered with one or more materials that may isolate the external power source 504 from the EM radiations that may be present in near proximity of the SP-RF device 502.

Figure 6:
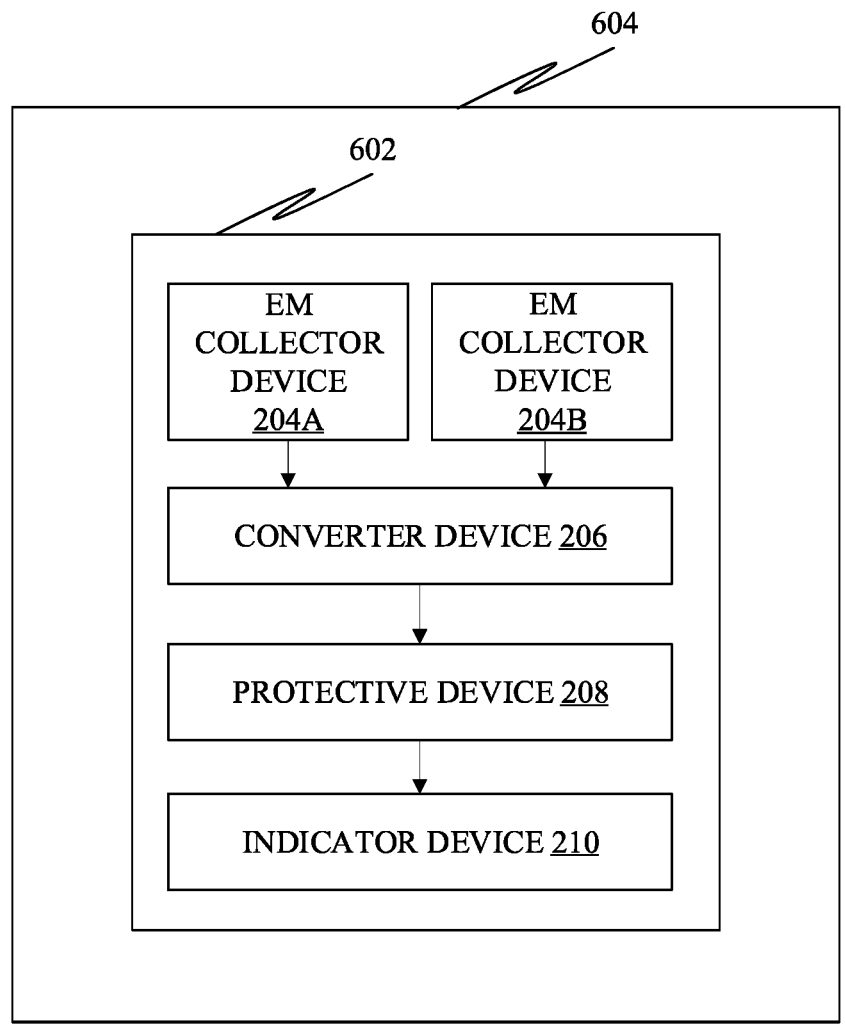
FIG. 6 illustrates a block diagram representation of an SP-RF device that may be configured to be mounted on an unmanned aerial vehicle, in accordance with some embodiments.

FIG. 6 illustrates a block diagram representation of an SP-RF device 602 that may be configured to be mounted on an unmanned aerial vehicle 604, in accordance with some embodiment. Further, the SP-RF device 602, in some embodiments, may be designed in a shape that may be compact, portable, and/or mobile etc. Further, the shape, in an instance, may include, but not limited to, spherical, square, rectangular, conical etc. Further, the SP-RF device 602, in some embodiments, may be designed with the shape that may be as compact as a tip of a pencil eraser by using SMD (surface-mount device) components. Further, the SP-RF device 602, in some embodiments, may be configured to be placed and/or disposed on the unmanned aerial vehicle 604 (such as a drone). The unmanned aerial vehicle 604, in an instance, may freely maneuver in the space 212 and/or may be able to reach a desired location in the space 212. Further, the desired location, in an instance, may be difficult and/or uneconomical to reach by a person. For instance, the desired location may include, but not limited to, a high voltage power line, a militarized zone, a construction site etc. Further, the desired location, in an instance, may be any location in the space 212 that may not include an antenna blind cone. The antenna blind cone, in an instance, may be an area and/or volume of the space 212 that may not be scanned by an antenna because of limitations of a structure and/or mount of the antenna. Further, the antenna blind cone, in an instance, may also be called as a cone of silence and/or an antenna blind spot as a strength of the electromagnetic radiations in such volume of the space 212 may be negligible and/or may tend to zero. Further, in some embodiments, the unmanned aerial vehicle 604, in an instance, may be controlled and/or positioned by a user that may be present on a ground. Further, the unmanned aerial vehicle 604, in an instance, may not be positioned in the antenna blind cone of the antenna by the user. Further, in another embodiment, the SP-RF device 602 may be configured to position and/or control the unmanned aerial vehicle 604 in a way such that the antenna blind cone may be prevented. Further, the SP-RF device 602, in an instance, may be electrically coupled with the unmanned aerial vehicle 604 through a wired and/or wireless communication channel. Further, the wired and/or wireless communication channel, in an instance, may allow the SP-RF device 602 to transmit and/or receive electrical signals to and/or from the unmanned aerial vehicle 604. The electrical signals, in an instance, may be signals that may actuate one or more motors of the unmanned aerial vehicle 604 in order to navigate and/or control the unmanned aerial vehicle 604 to the desired location.

Figure 7:
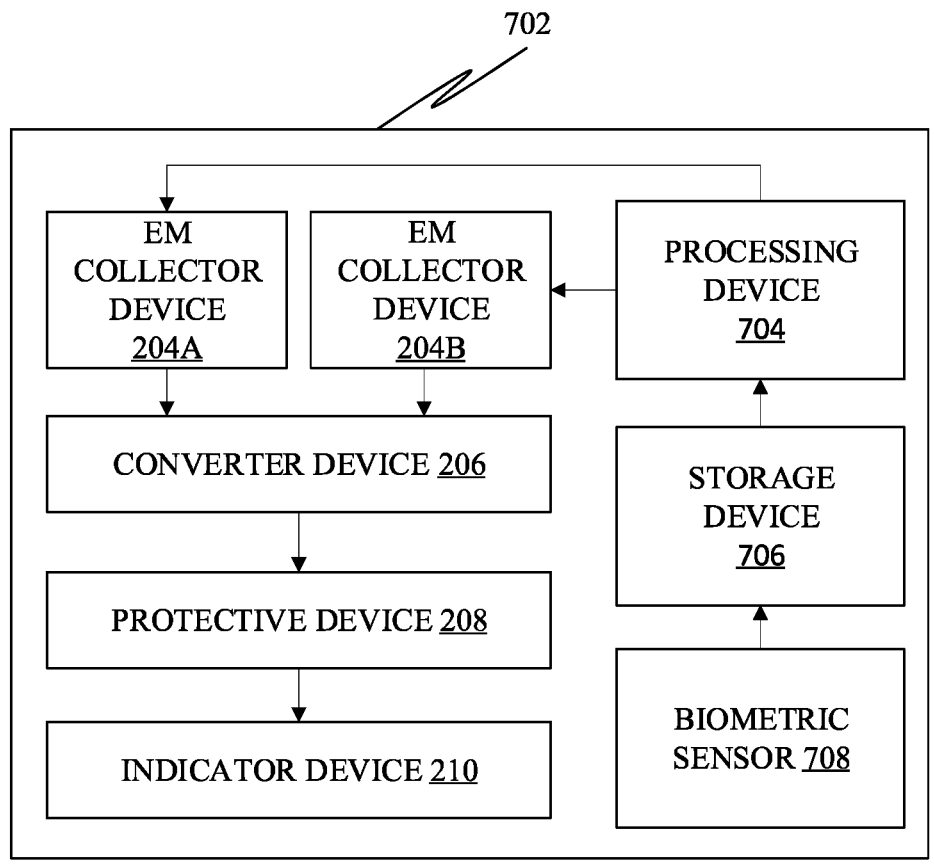
FIG. 7 illustrates a block diagram representation of an SP-RF device that may include a biometric sensor, in accordance with some embodiments.

FIG. 7 illustrates a block diagram representation of an SP-RF device 702 that may include a biometric sensor 708, in accordance with some embodiment. Accordingly, the biometric sensor 708, in an instance, may be configured to sense one or more biometrics of the user in order to identify an identity of the user. Further, the one or more biometrics, in an instance, may be any feature and/or characteristics of the user that may uniquely identify the user. The one or more biometrics, in an instance, may include, but not limited to, fingerprints, iris pattern, facial pattern, skeletal structure etc. Further, the one or more biometrics, in an instance, may be collected by the biometric sensor 708 that may be embedded within the SP-RF device 702. Further, the biometric sensor 708, in an instance, may include, but not limited to, a fingerprint scanner, an iris scanner, an IR dot projector etc. Further, a sensory data from the biometric sensor 708, in an instance, may be stored in a storage device 706. The sensory data, in an instance, may be any data that may reflect the one or more biometrics in a digital form. Further, the storage device 706, in an instance, may be a digital storage space that may store the sensory data received from the biometric sensor 708 of the SP-RF device 702. Further, the sensory data stored in the storage device 706, in an instance, may be processed by a processing device 704. The processing device 704, in an instance, may be a device that may be configured to analyze the sensory data in order to automatically tune the plurality of EM collector device 204 (such as EM collector 204A and 204B as shown in the FIG. 2) for collecting the EM radiation of a frequency band that the user may want to detect. Further, the processing device 704, in an instance, may carry out a computer program by performing arithmetic, logical, and/or control operations for determining the frequency band for which the EM collector device 204 may be automatically tuned based on the sensory data received from the biometric sensor 708. For instance, the user may be a field technician for a TV broadcasting company that may wish to detect and/or determine a presence of the EM radiation with the frequency band of HF (high frequency) and/or VHF (very high frequency). The SP-RF device 702, in an aforementioned instance, may store the identity (the one or more biometrics) of the user and/or may automatically tune (using the processing device 704) the EM collector device 204 to collect the EM radiation with the frequency band of HF and/or VHF. Further, in a certain case, the user may be a military person that may wish to detect and/or determine a presence of the EM radiation with the frequency band of UHF (Ultra high frequency) of up to GHz of frequencies. Accordingly, in the aforementioned case, the SP-RF device 702 may store the identity (the one or more biometrics) of the user and/or may automatically tune (using the processing device 704) the EM collector device 204 to collect the EM radiation with the frequency band of UHF of up to GHz frequency.

Figure 8:
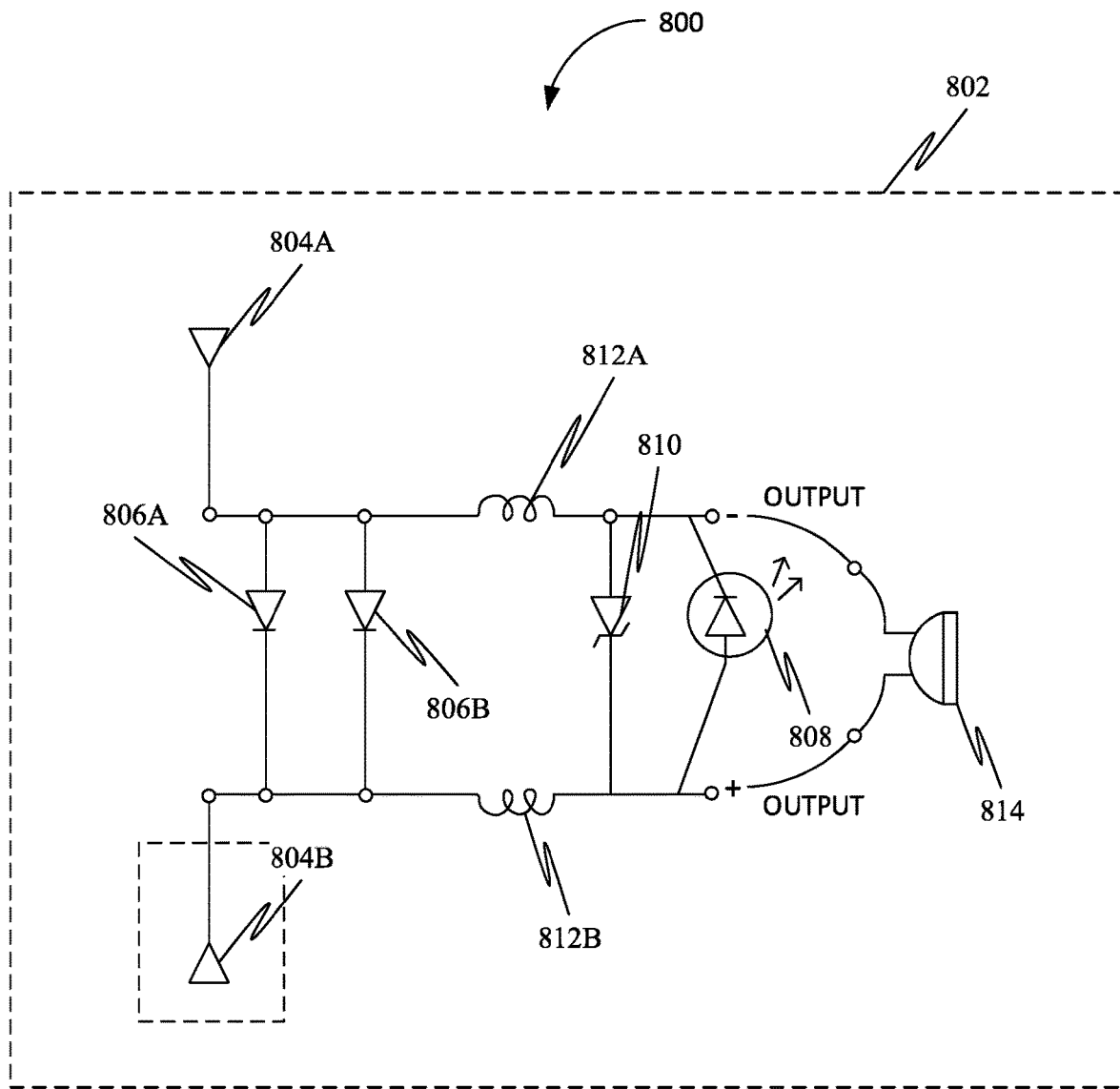
FIG. 8 illustrates a circuit diagram representation of an electrical circuit of an SP-RF device, in accordance with some embodiments.

FIG. 8 illustrates a circuit diagram representation of an electrical circuit 802 of an SP-RF device 800, in accordance with some embodiment. Accordingly, the electrical circuit 802 of the SP-RF device 800, in an instance, may include, but not limited to, a plurality of RF pickup elements 804 (such as 804A and 804B, as shown in FIG. 8), a plurality of diodes 806 (such as 806A and 806B, as shown in FIG. 8), a plurality of inductors 812 (such as 812A and 812B, as shown in FIG. 8), a voltage clipper 810, an LED 808, and/or a speaker 814 etc. Further, the plurality of RF pickup elements 804, in an instance, may be collector devices that may be configured to collect an electromagnetic radiation from a surrounding of the SP-RF device 800. Further, the electromagnetic radiations, in an instance, may include radio waves, microwaves, infrared etc. based on one or more frequencies. The one or more frequencies, in an instance, may include, but not limited to, low frequencies (LF), high frequencies (HF), very high frequencies (VHF), ultra-high frequencies (UHF), and/or microwave frequencies etc. Further, the plurality of RF pickup elements 804, in an instance, may be configured to collect an electromagnetic energy of the electromagnetic radiations with a plurality of frequency bands (such as an LF band, an HF band, a VHF band, a UHF band, and/or a microwave frequency band etc.). For instance, a first RF pickup element 804A may be configured to collect the electromagnetic energy of one frequency band (such as LF band) and a second RF pickup element 804B may be configured to collect the electromagnetic energy of another frequency band (such as VHF and/or UHF band for TV broadcasting). Further, in some embodiments, the first RF pickup 804A element may be configured to collect the electromagnetic energy of a wide range of frequencies that may be used to energize the electrical circuit 802 of the SP-RF device 800. Whereas, the second RF pickup element 804B may be configured and/or tuned in a way to collect the electromagnetic energy of a desired frequency that the user may wish to detect. Further, each of the RF pickup element 804, in an instance, may be configured in different shape and/or style (such as coil shape, spiral shape, square, triangular, dipole etc.) for collecting the electromagnetic energy of different frequency bands.

Further, the plurality of diodes 806, in an instance, may be semiconductor devices that may convert the electromagnetic energy collected from the plurality of RF pickup elements 804 by allowing a current to flow through the plurality of diodes 806. Further, the diodes 806 (such as 806A and/or 806B, as shown in FIG. 8), in an instance, may include, but not limited to, small signal fast switching diodes, and/or microwave diodes etc. Further, the small signal fast switching diode, in an instance, may be fast switching Schottky diode such as 1N4148 diode, and/or equivalent that may convert the electromagnetic energy with a frequency ranging from 500 KHz to 100 MHz. Further, the microwave diodes, in an instance, may be a microwave RF Schottky detector diode that may convert the electromagnetic energy with frequency ranging from VHF (and/or UHF) to 10 GHz.

Further, the plurality of inductors 812, in an instance, may be a ferrite inductor. Further, the ferrite inductor, in an instance, may be an electrical inductor that may be configured to oppose a sudden change in a current that may be passing through the LED 808 and/or the speaker 814. Further, the ferrite inductors, in an instance, may function as an RF filter that may block and/or isolate any AC RF current going to the LED 808 (and/or the speaker 814) and/or may protect the LED 808 (and/or the speaker 814) from an erratic RF transmission. Further, the voltage clipper 810, in an instance, may regulate a voltage level across the LED 808 and/or the speaker 814 in a way such that the voltage level may not cross a value that may damage the LED 808 and/or the speaker 814 and/or may jeopardize the SP-RF device 800. Further, the voltage clipper 810, in an instance, may include, but not limited to, a zener diode. The zener diode, in an instance, may be a p-n junction semiconductor diode that may be configured to maintain a voltage level across the LED 808 and/or the speaker 814.

Further, the LED 808, in an instance, may be a light emitting diode that may illuminate with a bright intensity and/or may indicate the user about the presence of the electromagnetic radiation in the surrounding of the SP-RF device 800. Further, in some embodiments, the LED 808 may be electrically connected in series and/or in parallel combination in a way such that the LED 808 may operate at a rated voltage and/or current magnitude (such as 3 volts and 15 mA, and/or 2.5 volts and 20 mA etc.). Further, the LED 808, in an instance, may be of different colors (such as green, red, blue, yellow etc.) in order to indicate the presence of various electromagnetic radiations of different frequency bands. For instance, the LED 808 may illuminate a red color when the electromagnetic radiation of UHF band (such as 400 MHz, 500 MHz etc.) may be collected by the RF pickup element 804, whereas, the LED 808 may illuminate a blue color when the electromagnetic radiation of LF band (such as 250 KHz etc.) may be collected by the RF pickup element 804. Further, in some embodiments, the LED 808, in an instance, may be of different colors (such as green, red, blue, yellow etc.) with varied luminance intensity in order to indicate a signal strength of the electromagnetic radiations that may be present in the surrounding of the SP-RF device 800. Further, the signal strength, in an instance, may represent an intensity and/or magnitude of the EM radiation that may be present in the surrounding of the SP-RF device 800. For instance, the LED 808 may illuminate a bright red color when the electromagnetic radiation may be having a relatively stronger signal strength, whereas, the LED 808 may illuminate a blue color (and/or a low-intensity red color) when the electromagnetic radiation may have a weak signal strength in the surrounding of the SP-RF device 800.

Further, the speaker 814, in an instance, may provide an alarm sound and/or chime when the electromagnetic radiation may be detected by the RF pickup element 804. Further, the speaker 814, in an instance, may be electrically connected in series and/or in parallel combination in a way such that the speaker 814 may operate at a rated voltage and/or current magnitude. Further, in some embodiments, a volume of the alarm sound and/or chime by the speaker 814 may be adjusted based on the signal strength of the EM radiation that may be collected by the RF pickup element 804. For instance, a high volume of the alarm sound and/or chime may be produced by the speaker 814 when the signal strength of the EM radiation collected by the RF pickup element 804 may be strong (such as when the SP-RF device 800 may be placed in close proximity to any radiating element).

FIG. 9 illustrates a user 902 that may be using a cardiac pacemaker 904 and/or may be wearing cloth that may be equipped with the SP-RF device 202 (as shown in FIG. 2), in accordance with some embodiments. Accordingly, the user 902, in an instance, may be suffering from a health problem and/or may get adversely affected with an exposure of strong EM radiation on the user 902. Further, the user 902, in an instance, may be implanted with the cardiac pacemaker 904 that may not be isolated from the electromagnetic radiations that may be present around the user 902. The strong electromagnetic radiations, in an instance, may disturb a functioning of the cardiac pacemaker 904 and/or may jeopardize the user 902. Further, the SP-RF device 202, in an instance, may be configured to alert (by using the indicator device 210, as mentioned in FIG. 2, that may include an LED, a vibrating mechanism, and/or a speaker etc.) the user 902 when the strong electromagnetic radiations may be collected by the plurality of the EM collector 204 (such as EM collector 204A and 204B as shown in FIG. 2) of the by the SP-RF device 202 in a surrounding of the user 902.

Figure 13:
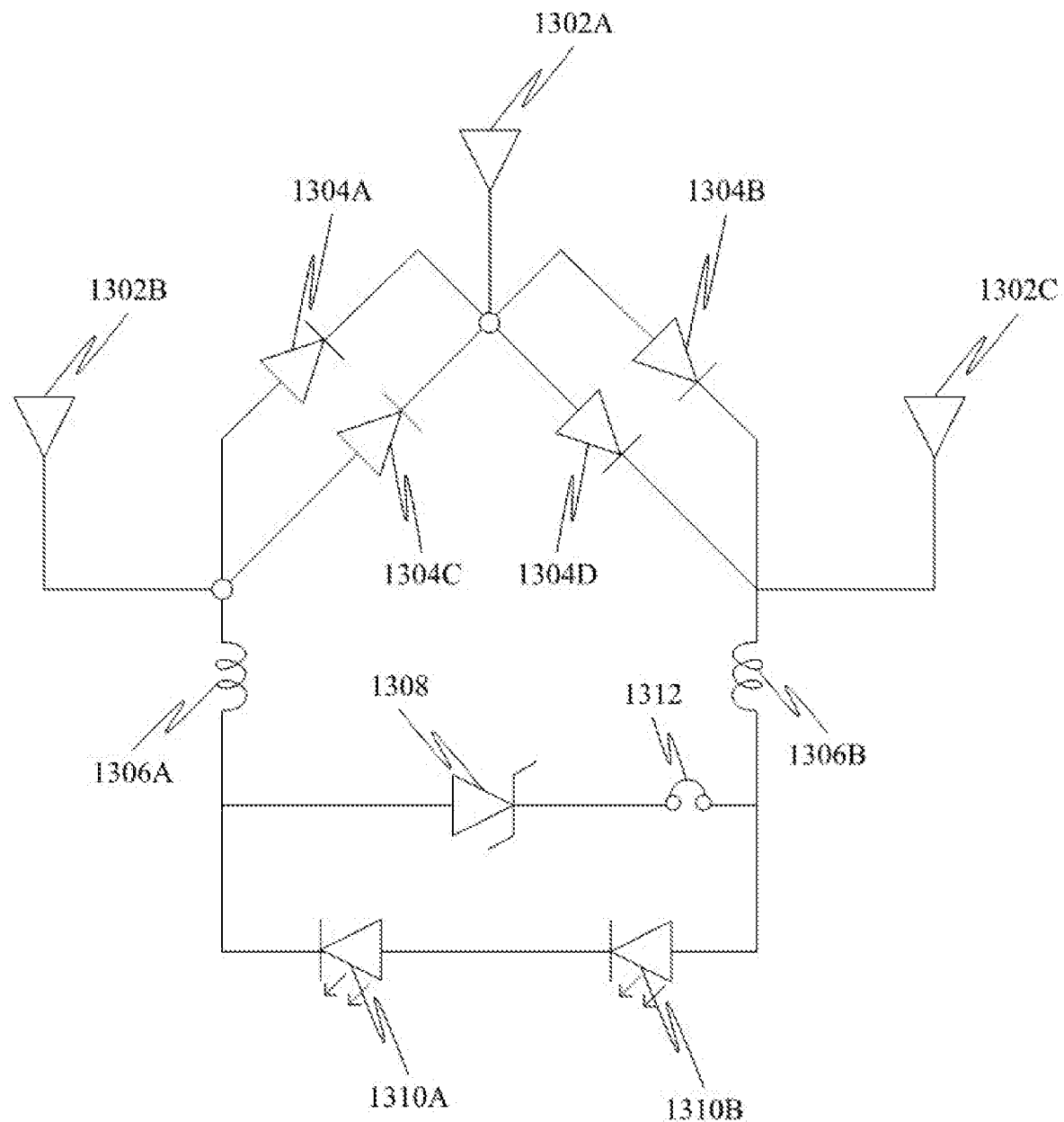
FIG. 13 illustrates a circuit diagram representation of an SP-RF device that may include a plurality of RF pickup elements, a plurality of diodes, a plurality of inductors, a zener diode, a plurality of LEDs, and/or a connection jumper etc.

FIG. 13 illustrates a circuit diagram representation of an SP-RF device 1300 that may include a plurality of RF pickup elements 1302 (such as 1302A, 1302B, and 1302C as shown in FIG. 13), a plurality of diodes 1304 (such as 1304A, 1304B, and 1304C, as shown in FIG. 13), a plurality of inductors 1306 (such as 1306A and 1306B, as shown in FIG. 13), a zener diode 1308, a plurality of LED 1310 (such as 1310A and 1310B), and/or a connection jumper 1312 etc., in accordance with some embodiment. Accordingly, the plurality of RF pickup elements 1302, in an instance, may be collector devices that may be configured to collect an electromagnetic radiation from a surrounding of the SP-RF device 1300. Further, the electromagnetic radiations, in an instance, may include radio waves, microwaves, infrared etc. based on one or more frequencies. The one or more frequencies, in an instance, may include, but not limited to, low frequencies (LF), high frequencies (HF), very high frequencies (VHF), ultra-high frequencies (UHF), and/or microwave frequencies etc. Further, the plurality of RF pickup elements 1302, in an instance, may be configured to collect an electromagnetic energy of the electromagnetic radiations with a plurality of frequency bands (such as an LF band, an HF band, a VHF band, a UHF band, and/or a microwave frequency band etc.). For instance, a first RF pickup element 1302A may be configured to collect the electromagnetic energy of one frequency band (such as LF band) and a second RF pickup element 1302B may be configured to collect the electromagnetic energy of another frequency band (such as VHF and/or UHF band for TV broadcasting).

Further, the RF pickup element 1302A, in an instance, may be a main RF detection point connected to the plurality of diodes 1304 (1304A, 1304B, 1304C, & 1304A) with the diode 1304A & 1304B and 1304C & 1304D has a special detection function. Further, the 1304A & 1304B, in an instance, may detect lower frequencies from kilohertz up to few hundred megahertz (around 150 MHz) with good sensitivity, while 1304C & 1304D, in an instance, may have a good sensitivity for up to Gigahertz frequency due to microwave characteristic of a diode. Further, combining the diode 1304A, 1304B, 1304C & 1304D, in an instance, may make the SP-RF device 1300 becoming broadband from kilohertz to gigahertz detection. Further, the inductor 1306A and/or 1306B, in an instance, may protect and/or isolate DC voltage on an LED side and/or may block the LED 1310 from any AC RF signal interference detected by the diode 1304. Further, the zener diode 1308, in an instance, may also protect the LED 1310 and/or the circuit from an overload due to a strong RF power that may be present in a surrounding of the SP-RF device 1300.

Further, The RF pickup element 1302A, in some embodiments, may serve as a main RF detector element that may make the SP-RF device 1300 to function as a self-powered RF detection that may lights/monitor even without a counterpoise RF pickup element such as the RF pickup element 1302B and 1302C. Further, the RF pickup element 1302B and 1302C, in an instance, may be optional if the SP-RF device 1300 may be used in a higher RF power transmitter (kilowatts) like AM/FM/TV broadcast antenna monitoring. Further, the RF pickup element 1302B and 1302C, in an instance, may be configured in different shape and/or style inside an enclosure that may include coil shape, spiral, square, triangular, dipole etc.

Further, the plurality of LEDs 1310 (such as 1310A and 1310B), in an instance, may also be optional. Further, one LED 1310A, in an instance, may be enough if a plastic box enclosure may nit not have enough space. Further, a protection circuit may also be used with the zener diode 1308 that may limit a maximum voltage input to the LED 1310 around 2.4 volts maximum for each LED 1310A and 1310B. Although, a current during a test may be measured to be around 15 to 20 milliamps, the inductor 1306A and/or 1306B may also be an important component that may function as an RF filter or RF trap. Further, the 1306A and/or 1306B, in an instance, may block and/or may isolate any AC RF voltage going to the LED 1310 and/or may protect the LED 1310 from erratic RF transmission.

Further, the zener diode 1308, in an instance, may be a p-n junction semiconductor diode that may be configured to maintain a voltage level across the LED 1310A and 1310B. Further, the zener diode 1308, in an instance, may be serially connected with a connection jumper 1312. The connection jumper 1312, in one embodiment, may be a manual switch that may be turned on and/or off by the user to electrically connect and/or disconnect the zener diode 1308 from other components of the SP-RF device 1300. Further, the connection jumper 1312, in another embodiment, may be an automatic switch that may be turned on and/or off automatically by the SP-RF device 1300 to include and/or exclude the zener diode 1308 from the SP-RF device 1300 based on a data received from a voltage sensor. Further, the voltage sensor, in an instance, may be configured to provide a real-time voltage level to the connection jumper 1312 that may electrically connect the zener diode 1308 with the LED 1310 when the voltage level may be higher than a threshold value. For instance, for the SP-RF device 1300 with the LED 1310 (such as the LED 1310A with 3 volt rating) may observe (through the voltage sensor) a sudden voltage surge of more than the threshold value (such as 3.8 volts), then the connection jumper 1312 may electrically connect the zener diode 1308 across the LED 1310 to regulate the voltage level up to 3 volts.

Embodiments

According to some embodiments, a self-powered radio frequency device for detecting electromagnetic (EM) radiation is disclosed. The self-powered radio frequency device may include a plurality of EM collector devices 204 configured for collecting EM radiation corresponding to a plurality of frequency bands. Further, the self-powered radio frequency device may include at least one converter device 206 electrically coupled to the plurality of EM collector devices 204. Further, the at least one converter device 206 may be configured for converting the EM radiation into electrical energy. Further, the self-powered radio frequency device may include at least one indicator device electrically coupled to the at least one converter device 206. Further, the at least one indicator device may be configured for generating at least one indication based on the electrical energy corresponding to at least one frequency band of the plurality of frequency bands.

In some embodiments, the plurality of frequency bands may include two or more frequency bands selected from the group comprising LF band, HF band, VHF band, UHF band, and microwave frequency band.

In some embodiments, the plurality of EM collector devices 204 may include at least one first EM collector device configured for collecting EM radiation corresponding to a wide frequency band and at least one second EM collector device configured for collecting EM radiation corresponding to a narrow frequency band.

In some embodiments, the self-powered radio frequency device may further include an energy storage device electrically coupled to the at least one converter device 206. Further, the energy storage device may be configured for storing electrical energy. Further, the self-powered radio frequency device may include a charge switching device electrically coupled to each of the energy storage device and the at least one converter device 206. Further, the charge switching device may be configured for remaining in one of a first switching state and a second switching state. Further, the charge switching device may be configured for facilitating charging of the energy storage device while in the first switching state and facilitating discharging of the energy storage device while in the second switching state.

In some embodiments, the self-powered radio frequency device may further include an input device configured for receiving indication of at least one characteristic associated with the EM radiation. Further, the self-powered radio frequency device may include a communication device communicatively coupled to the input device. Further, the communication device may be configured for transmitting the indication of the at least one characteristic to an online platform. Further, the communication device may be configured for receiving at least one configuration parameter from the online platform. Further, the at least one configuration parameter may be associated with the at least one characteristic. Further, one or more of the plurality of EM collector devices 204, the at least one converter device 206 and the at least one indicator device may be configured based on the at least one configuration parameter. Further, the self-powered radio frequency device may include a storage device communicatively coupled to the communication device. Further, the storage device may be configured for storing the at least one configuration parameter in association with indication of the at least one characteristic. Further, the self-powered radio frequency device may include a processing device communicatively coupled to the communication device. Further, the processing may be further communicatively coupled to one or more of the plurality of EM collector devices 204, the at least one converter device 206 and the at least one indicator device 210. Further, the processing device may be further configured for configuring one or more of the plurality of EM collector devices 204, the at least one converter device 206 and the at least one indicator device based on the at least one configuration parameter. Further, the self-powered radio frequency device may include a battery (e.g. external power source 504) configured for supplying electrical power to each of the communication device, the processing device, the storage device and the input device.

In some embodiments, the at least one characteristic corresponds to at least one EM transmitter configured for transmitting the EM radiation.

In some embodiments, the at least one indicator device may include a plurality of indicator device 210. Further, each indicator device of the plurality of indicator device 210 corresponds to a frequency band of the plurality of frequency bands.

In some embodiments, the at least one indicator device may include a plurality of indicator device 210. Further, each indicator device of the plurality of indicator device 210 corresponds to an intensity level of a plurality of intensity levels associated with the EM radiation.

In some embodiments, the at least one indicator device may be configured for generating one or more of a visual indication, an audible indication and a tactile indication.

In some embodiments, the self-powered radio frequency device may further include a protective device 208 electrically coupled to the at least one indicator device 210. Further, the protective device 208 may be configured for protecting the at least one indicator device from one or more of overvoltage and overcurrent.

In some embodiments, the self-powered radio frequency device may further include a connection jumper electrically coupled to each of the protective device 208 and the at least one indicator device 210. Further, the connection jumper may be configured for electrically connecting the protective device 208 to the at least one indicator device in a connected state and electrically disconnecting the protective device 208 from the at least one indicator device in a disconnected state.

In some embodiments, the protective device 208 may include one or more of a zener diode and a ferrite inductor.

In some embodiments, the self-powered radio frequency device may further include an attachment means configured for removably attaching the self-powered radio frequency device to an EM transmitter configured for transmitting the EM radiation.

In some embodiments, the self-powered radio frequency device may further include an orientation sensor 308 configured for generating orientation data corresponding to the plurality of EM collector devices 204. Further, the self-powered radio frequency device may include an electromechanical system 304 coupled to at least one EM collector device of the plurality of EM collector devices 204. Further, an electromechanical system 304 may be configured for varying an orientation of a corresponding EM collector device. Further, the self-powered radio frequency device may include a processing device 308 communicatively coupled to the electromechanical system 304. Further, the processing device 308 may be configured for receiving indication of at least one characteristic associated with the EM radiation. Further, the processing device 308 may be configured for controlling the electromechanical system 304 based on the indication of the at least one characteristic.

In some embodiments, the self-powered radio frequency device may further include a location sensor 404 configured for generating location data corresponding to the self-powered radio frequency device. Further, the self-powered radio frequency device may include a storage device 406 communicatively coupled to the location sensor 404. Further, the storage device 406 may be configured for storing the at least one indication in association with the location data.

In some embodiments, the self-powered radio frequency device may further include an energy source including one or more of a solar power generator and a wind power generator. Further, the energy source may be electrically coupled to one or more of the plurality of EM collector devices 204, the at least one converter device 206 and the at least one indicator device 210.

In some embodiments, the self-powered radio frequency device may further include an unmanned aerial vehicle capable of flight. Further, operation of the UAV may be controllable from a wireless controller.

In some embodiments, the self-powered radio frequency device may further include at least one biometric sensor 708 configured for detecting at least one biometric variable associated with a user of the self-powered radio frequency device. Further, the self-powered radio frequency device may include a storage device 706 configured for storing the at least one indication in association with the at least one biometric variable. Further, the self-powered radio frequency device may further include a communication device communicatively coupled to the storage device 706. Further, the communication device may be configured for transmitting each of the at least one indication and the at least one biometric variable to an online platform.

In some embodiments, the plurality of EM collector devices 204 may include a plurality of antennas 804. Further, the at least one converter device 206 may include a diode based rectifier 806. Further, the at least one indicator device may include at least one LED 814.

In some embodiments, the self-powered radio frequency device may further include a filtering device 812 electrically coupled between an output of the at least one converter device 206 and an input of the at least one indicator device 210. Further, the filtering device may be configured for suppressing alternative current (AC) components while allowing direct current (DC) component towards the at least one indicator device 210.

Figure 14:
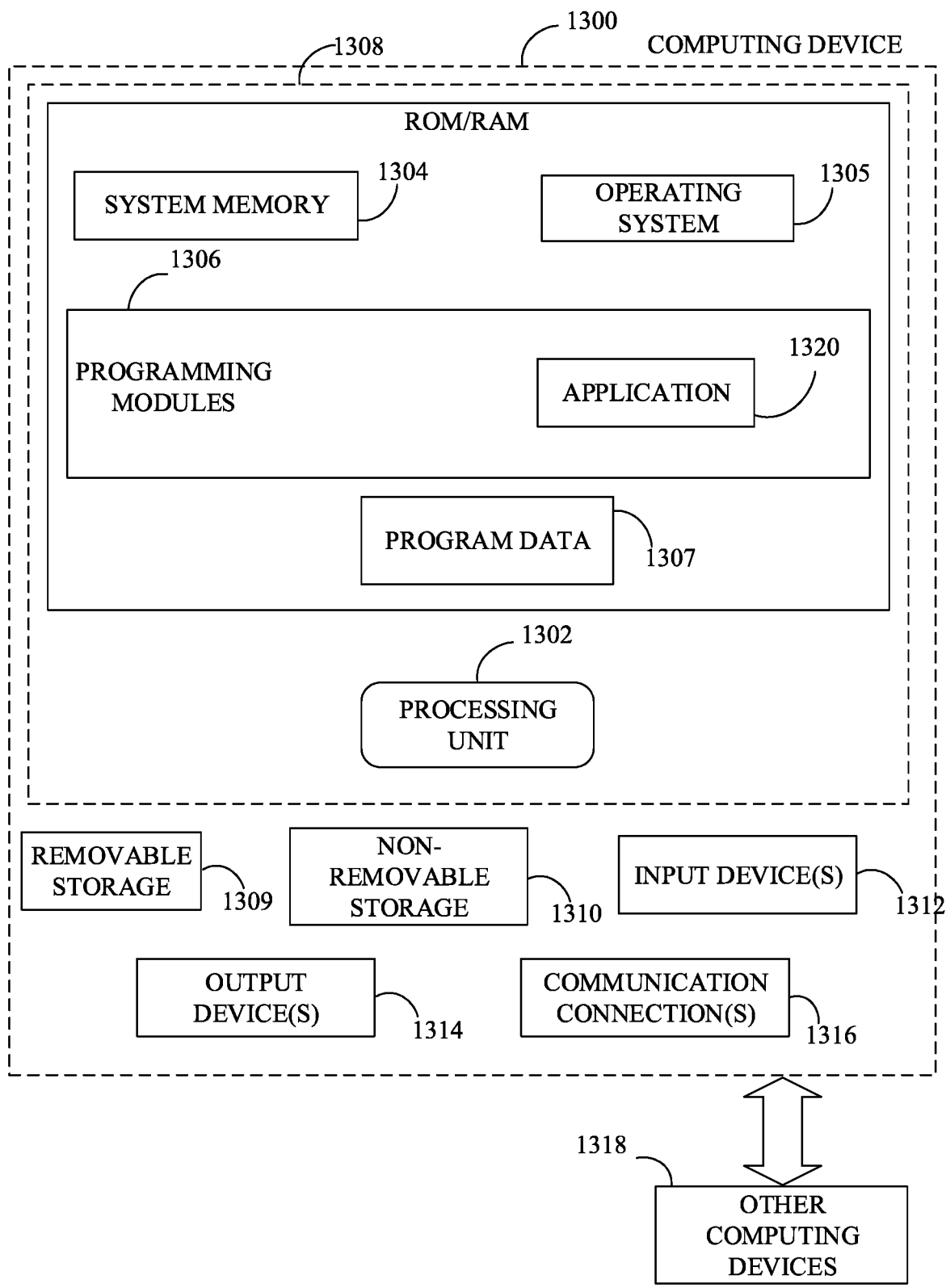
FIG. 14 is a block diagram of a computing device for implementing the methods disclosed herein, in accordance with some embodiments.

With reference to FIG. 14, a system consistent with an embodiment of the disclosure may include a computing device or cloud service, such as computing device 1400. In a basic configuration, computing device 1400 may include at least one processing unit 1402 and a system memory 1404. Depending on the configuration and type of computing device, system memory 1404 may comprise, but is not limited to, volatile (e.g. random-access memory (RAM)), non-volatile (e.g. read-only memory (ROM)), flash memory, or any combination. System memory 1404 may include operating system 1405, one or more programming modules 1406, and may include a program data 1407. Operating system 1405, for example, may be suitable for controlling computing device 1400's operation. In one embodiment, programming modules 1406 may include image-processing module, machine learning module and/or image classifying module. Furthermore, embodiments of the disclosure may be practiced in conjunction with a graphics library, other operating systems, or any other application program and is not limited to any particular application or system. This basic configuration is illustrated in FIG. 14 by those components within a dashed line 1408.

Computing device 1400 may have additional features or functionality. For example, computing device 1400 may also include additional data storage devices (removable and/or non-removable) such as, for example, magnetic disks, optical disks, or tape. Such additional storage is illustrated in FIG. 14 by a removable storage 1409 and a non-removable storage 1410. Computer storage media may include volatile and nonvolatile, removable and non-removable media implemented in any method or technology for storage of information, such as computer-readable instructions, data structures, program modules, or other data. System memory 1404, removable storage 1409, and non-removable storage 1410 are all computer storage media examples (i.e., memory storage.) Computer storage media may include, but is not limited to, RAM, ROM, electrically erasable read-only memory (EEPROM), flash memory or other memory technology, CD-ROM, digital versatile disks (DVD) or other optical storage, magnetic cassettes, magnetic tape, magnetic disk storage or other magnetic storage devices, or any other medium which can be used to store information and which can be accessed by computing device 1400. Any such computer storage media may be part of device 1400. Computing device 1400 may also have input device(s) 1412 such as a keyboard, a mouse, a pen, a sound input device, a touch input device, a location sensor, a camera, a biometric sensor, etc. Output device(s) 1414 such as a display, speakers, a printer, etc. may also be included. The aforementioned devices are examples and others may be used.

Computing device 1400 may also contain a communication connection 1416 that may allow device 1400 to communicate with other computing devices 1418, such as over a network in a distributed computing environment, for example, an intranet or the Internet. Communication connection 1416 is one example of communication media. Communication media may typically be embodied by computer readable instructions, data structures, program modules, or other data in a modulated data signal, such as a carrier wave or other transport mechanism, and includes any information delivery media. The term "modulated data signal" may describe a signal that has one or more characteristics set or changed in such a manner as to encode information in the signal. By way of example, and not limitation, communication media may include wired media such as a wired network or direct-wired connection, and wireless media such as acoustic, radio frequency (RF), infrared, and other wireless media. The term computer readable media as used herein may include both storage media and communication media.

As stated above, a number of program modules and data files may be stored in system memory 1404, including operating system 1405. While executing on processing unit 1402, programming modules 1406 (e.g., application 1420 such as a media player) may perform processes including, for example, one or more stages of methods, algorithms, systems, applications, servers, databases as described above. The aforementioned process is an example, and processing unit 1402 may perform other processes. Other programming modules that may be used in accordance with embodiments of the present disclosure may include sound encoding/decoding applications, machine learning application, acoustic classifiers etc.

Generally, consistent with embodiments of the disclosure, program modules may include routines, programs, components, data structures, and other types of structures that may perform particular tasks or that may implement particular abstract data types. Moreover, embodiments of the disclosure may be practiced with other computer system configurations, including hand-held devices, general purpose graphics processor-based systems, multiprocessor systems, microprocessor-based or programmable consumer electronics, application specific integrated circuit-based electronics, minicomputers, mainframe computers, and the like. Embodiments of the disclosure may also be practiced in distributed computing environments where tasks are performed by remote processing devices that are linked through a communications network. In a distributed computing environment, program modules may be located in both local and remote memory storage devices.

Furthermore, embodiments of the disclosure may be practiced in an electrical circuit comprising discrete electronic elements, packaged or integrated electronic chips containing logic gates, a circuit utilizing a microprocessor, or on a single chip containing electronic elements or microprocessors. Embodiments of the disclosure may also be practiced using other technologies capable of performing logical operations such as, for example, AND, OR, and NOT, including but not limited to mechanical, optical, fluidic, and quantum technologies. In addition, embodiments of the disclosure may be practiced within a general-purpose computer or in any other circuits or systems.

Embodiments of the disclosure, for example, may be implemented as a computer process (method), a computing system, or as an article of manufacture, such as a computer program product or computer readable media. The computer program product may be a computer storage media readable by a computer system and encoding a computer program of instructions for executing a computer process. The computer program product may also be a propagated signal on a carrier readable by a computing system and encoding a computer program of instructions for executing a computer process. Accordingly, the present disclosure may be embodied in hardware and/or in software (including firmware, resident software, micro-code, etc.). In other words, embodiments of the present disclosure may take the form of a computer program product on a computer-usable or computer-readable storage medium having computer-usable or computer-readable program code embodied in the medium for use by or in connection with an instruction execution system. A computer-usable or computer-readable medium may be any medium that can contain, store, communicate, propagate, or transport the program for use by or in connection with the instruction execution system, apparatus, or device.

The computer-usable or computer-readable medium may be, for example but not limited to, an electronic, magnetic, optical, electromagnetic, infrared, or semiconductor system, apparatus, device, or propagation medium. More specific computer-readable medium examples (a non-exhaustive list), the computer-readable medium may include the following: an electrical connection having one or more wires, a portable computer diskette, a random-access memory (RAM), a read-only memory (ROM), an erasable programmable read-only memory (EPROM or Flash memory), an optical fiber, and a portable compact disc read-only memory (CD-ROM). Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory.

Embodiments of the present disclosure, for example, are described above with reference to block diagrams and/or operational illustrations of methods, systems, and computer program products according to embodiments of the disclosure. The functions/acts noted in the blocks may occur out of the order as shown in any flowchart. For example, two blocks shown in succession may in fact be executed substantially concurrently or the blocks may sometimes be executed in the reverse order, depending upon the functionality/acts involved.

While certain embodiments of the disclosure have been described, other embodiments may exist. Furthermore, although embodiments of the present disclosure have been described as being associated with data stored in memory and other storage mediums, data can also be stored on or read from other types of computer-readable media, such as secondary storage devices, like hard disks, solid state storage (e.g., USB drive), or a CD-ROM, a carrier wave from the Internet, or other forms of RAM or ROM. Further, the disclosed methods' stages may be modified in any manner, including by reordering stages and/or inserting or deleting stages, without departing from the disclosure.

Although the invention has been explained in relation to its preferred embodiment, it is to be understood that many other possible modifications and variations can be made without departing from the spirit and scope of the invention.

I claim:

1. A self-powered radio frequency device for detecting electromagnetic (EM) radiation, the self-powered radio frequency device comprising:
   a plurality of EM collector devices configured for collecting EM radiation corresponding to a plurality of frequency bands;
   at least one converter device electrically coupled to the plurality of EM collector devices, wherein the at least one converter device is configured for converting the EM radiation into electrical energy;
   at least one indicator device electrically coupled to the at least one converter device, wherein the at least one indicator device is configured for generating at least one indication based on the electrical energy corresponding to at least one frequency band of the plurality of frequency bands;
   a location sensor configured for generating location data corresponding to the self-powered radio frequency device;
   a storage device communicatively coupled to the location sensor, wherein the storage device is configured for storing the at least one indication in association with the location data;
   an orientation sensor configured for generating orientation data corresponding to the plurality of EM collector devices;
   an electromechanical system coupled to at least one EM collector device of the plurality of EM collector devices, wherein the electromechanical system is configured for varying an orientation of a corresponding EM collector device;
   a processing device communicatively coupled to the electromechanical system, wherein the processing device is configured for:
      receiving indication of at least one characteristic associated with the EM radiation; and
      controlling the electromechanical system based on the indication of the at least one characteristic.

2. The self-powered radio frequency device of claim 1, wherein the plurality of frequency bands comprises two or more frequency bands selected from the group comprising: LF band, HF band, VHF band, UHF band, and microwave frequency band.

3. The self-powered radio frequency device of claim 1, wherein the plurality of EM collector devices comprises at least one first EM collector device configured for collecting EM radiation corresponding to a wide frequency band and at least one second EM collector device configured for collecting EM radiation corresponding to a narrow frequency band.

4. The self-powered radio frequency device of claim 1 further comprising:
   an energy storage device electrically coupled to the at least one converter device, wherein the energy storage device is configured for storing electrical energy; and
   a charge switching device electrically coupled to each of the energy storage device and the at least one converter device, wherein the charge switching device is configured for remaining in one of a first switching state and a second switching state, wherein the charge switching device is configured for facilitating charging of the energy storage device while in the first switching state and facilitating discharging of the energy storage device while in the second switching state.

5. The self-powered radio frequency device of claim 1 further comprising:
   an input device configured for receiving indication of at least one characteristic associated with the EM radiation;
   a communication device communicatively coupled to the input device, wherein the communication device is configured for:
      transmitting the indication of the at least one characteristic to an online platform; and
      receiving at least one configuration parameter from the online platform, wherein the at least one configuration parameter is associated with the at least one characteristic, wherein at least one of the plurality of EM collector devices, the at least one converter device and the at least one indicator device is configured based on the at least one configuration parameter;
   a storage device communicatively coupled to the communication device, wherein the storage device is configured for storing the at least one configuration parameter in association with indication of the at least one characteristic;
   a processing device communicatively coupled to the communication device, wherein the processing is further communicatively coupled to at least one of the plurality of EM collector devices, the at least one converter device and the at least one indicator device, wherein the processing device is further configured for configuring at least one of the plurality of EM collector devices, the at least one converter device and the at least one indicator device based on the at least one configuration parameter; and
   a battery configured for supplying electrical power to each of the communication device, the processing device, the storage device and the input device.

6. The self-powered radio frequency device of claim 1, wherein at least one characteristic corresponds to at least one EM transmitter configured for transmitting the EM radiation.

7. The self-powered radio frequency device of claim 1, wherein the at least one indicator device comprises a plurality of indicator devices, wherein each indicator device of the plurality of indicator devices corresponds to a frequency band of the plurality of frequency bands.

8. The self-powered radio frequency device of claim 1, wherein the at least one indicator device comprises a plurality of indicator devices, wherein each indicator device of the plurality of indicator devices corresponds to an intensity level of a plurality of intensity levels associated with the EM radiation.

9. The self-powered radio frequency device of claim 1, wherein the at least one indicator device is configured for generating at least one of a visual indication, an audible indication and a tactile indication.

10. The self-powered radio frequency device of claim 1 further comprising a protective device electrically coupled to the at least one indicator device, wherein the protective device is configured for protecting the at least one indicator device from at least one of overvoltage and overcurrent.

11. The self-powered radio frequency device of claim 1 further comprising a connection jumper electrically coupled to each of a protective device and the at least one indicator device, wherein the connection jumper is configured for electrically connecting the protective device to the at least one indicator device in a connected state and electrically disconnecting the protective device from the at least one indicator device in a disconnected state.

12. The self-powered radio frequency device of claim 10, wherein the protective device comprises at least one of a zener diode and a ferrite inductor.

13. The self-powered radio frequency device of claim 1 further comprises an attachment means configured for removably attaching the self-powered radio frequency device to an EM transmitter configured for transmitting the EM radiation.

14. The self-powered radio frequency device of claim 1 further comprising an energy source comprising at least one of a solar power generator and a wind power generator, wherein the energy source is electrically coupled to at least one of the plurality of EM collector devices, the at least one converter device and the at least one indicator device.

15. The self-powered radio frequency device of claim 1 further comprising an unmanned aerial vehicle capable of flight, wherein operation of the UAV may be controllable from a wireless controller.

16. The self-powered radio frequency device of claim 1 further comprising:
   at least one biometric sensor configured for detecting at least one biometric variable associated with a user of the self-powered radio frequency device;
   a storage device configured for storing the at least one indication in association with the at least one biometric variable; and
   a communication device communicatively coupled to the storage device, wherein the communication device is configured for transmitting each of the at least one indication and the at least one biometric variable to an online platform.

17. The self-powered radio frequency device of claim 1, wherein the plurality of EM collector devices comprises a plurality of antennas, wherein the at least one converter device comprises a diode based rectifier, wherein the at least one indicator device comprises at least one LED.

18. The self-powered radio frequency device of claim 17 further comprising a filtering device electrically coupled between an output of the at least one converter device and an input of the at least one indicator device, wherein the filtering device is configured for suppressing alternative current (AC) components while allowing direct current (DC) component towards the at least one indicator device.

* * * * *